United States Patent
Fan et al.

(10) Patent No.: US 12,527,035 B2
(45) Date of Patent: Jan. 13, 2026

(54) NON-VOLATILE MEMORY DEVICE

(71) Applicant: IOTMEMORY TECHNOLOGY INC., Taipei (TW)

(72) Inventors: Der-Tsyr Fan, Taoyuan (TW); I-Hsin Huang, Taoyuan (TW); Tzung-Wen Cheng, New Taipei (TW); Yu-Ming Cheng, Yilan County (TW)

(73) Assignee: IOTMEMORY TECHNOLOGY INC., Taipei (TW)

( * ) Notice: Subject to any disclaimer, the term of this patent is extended or adjusted under 35 U.S.C. 154(b) by 336 days.

(21) Appl. No.: 18/090,468

(22) Filed: Dec. 28, 2022

(65) Prior Publication Data

US 2024/0162315 A1 May 16, 2024

Related U.S. Application Data

(60) Provisional application No. 63/424,139, filed on Nov. 10, 2022.

(51) Int. Cl.
| | |
|---|---|
| *H10D 30/68* | (2025.01) |
| *H10B 41/30* | (2023.01) |
| *H10D 30/01* | (2025.01) |
| *H10D 64/01* | (2025.01) |

(52) U.S. Cl.
CPC ......... *H10D 30/6892* (2025.01); *H10B 41/30* (2023.02); *H10D 30/0411* (2025.01); *H10D 30/683* (2025.01); *H10D 64/035* (2025.01)

(58) Field of Classification Search
None
See application file for complete search history.

(56) References Cited

U.S. PATENT DOCUMENTS

| | | | |
|---|---|---|---|
| 8,530,950 B1 | 9/2013 | Kang | |
| 2003/0162347 A1 | 8/2003 | Wang | |
| 2004/0041202 A1 | 3/2004 | Kim | |
| 2005/0006691 A1* | 1/2005 | Wu | H10B 69/00 |
| | | | 257/314 |
| 2005/0269624 A1 | 12/2005 | Hu | |
| 2006/0205136 A1 | 9/2006 | Tessariol | |

(Continued)

FOREIGN PATENT DOCUMENTS

| | | |
|---|---|---|
| JP | 7-106446 A | 4/1995 |
| JP | 11-111866 A | 4/1999 |

(Continued)

*Primary Examiner* — Xiaoming Liu
(74) *Attorney, Agent, or Firm* — Winston Hsu

(57) ABSTRACT

A non-volatile memory device includes at least one memory cell, and the memory cell includes a substrate, an assist gate structure, a tunneling dielectric layer, a floating gate, and an upper gate structure. The assist gate structure is disposed on the substrate. The floating gate includes two opposite first top edges arranged along a first direction, two opposite first sidewalls arranged along the first direction, and two opposite second sidewalls arranged along a second direction different from the first direction. The upper gate structure covers the assist gate structure and the floating gate, where at least one of the first top edges of the floating gate is embedded in the upper gate structure. Portions of the upper gate structure extend beyond the second sidewalls of the floating gate in the second direction, and the portions of the upper gate structure are disposed above the substrate.

20 Claims, 30 Drawing Sheets

(56) References Cited

U.S. PATENT DOCUMENTS

| | | | |
|---|---|---|---|
| 2007/0257299 A1* | 11/2007 | Chen | H10B 41/35 257/315 |
| 2011/0281427 A1 | 11/2011 | Choi | |
| 2012/0295413 A1 | 11/2012 | Fujii | |
| 2013/0026552 A1 | 1/2013 | Toh | |
| 2013/0112935 A1 | 5/2013 | Himeno | |
| 2013/0313626 A1 | 11/2013 | Huang | |
| 2014/0042383 A1 | 2/2014 | Inokuma | |
| 2016/0336415 A1 | 11/2016 | Wu | |
| 2016/0358928 A1 | 12/2016 | Wu | |
| 2016/0365350 A1 | 12/2016 | Chuang | |
| 2017/0040334 A1 | 2/2017 | Cheng | |
| 2020/0152649 A1* | 5/2020 | Chern | G11C 5/063 |
| 2020/0251480 A1 | 8/2020 | Jang | |
| 2020/0350325 A1* | 11/2020 | Zhang | H10D 84/038 |
| 2021/0066324 A1* | 3/2021 | Cai | H10B 41/10 |
| 2021/0358927 A1 | 11/2021 | Wang | |
| 2021/0384205 A1 | 12/2021 | Zhang | |
| 2021/0408119 A1 | 12/2021 | Himeno | |
| 2022/0293614 A1 | 9/2022 | Cai | |
| 2022/0293756 A1 | 9/2022 | Xing | |

FOREIGN PATENT DOCUMENTS

| | | |
|---|---|---|
| JP | 2014-96421 A | 5/2014 |
| RU | 2 216 821 C2 | 11/2003 |
| RU | 2 297 625 C1 | 4/2007 |
| TW | 200729514 | 8/2007 |
| TW | 201508753 A | 3/2015 |
| TW | M513458 U | 12/2015 |
| TW | 201633319 A | 9/2016 |
| TW | 201644037 A | 12/2016 |
| TW | 201839770 A | 11/2018 |
| TW | 202018917 A | 5/2020 |
| TW | 202114174 A | 4/2021 |
| TW | 202236627 A | 9/2022 |
| WO | 2020/179199 A1 | 9/2020 |
| WO | 2022/191864 A1 | 9/2022 |

\* cited by examiner

NON-VOLATILE MEMORY DEVICE

CROSS REFERENCE TO RELATED APPLICATIONS

This application claims the benefit of U.S. Provisional Application No. 63/424,139, filed on Nov. 10, 2022. The content of the application is incorporated herein by reference.

BACKGROUND OF THE INVENTION

1. Field of the Invention

The invention relates to a semiconductor device, and more particularly, the invention relates to a non-volatile memory device.

2. Description of the Prior Art

Since a non-volatile memory can, for instance, repeatedly perform operations such as storing, reading, and erasing data, and since stored data is not lost after the non-volatile memory is shut down, the non-volatile memory has been extensively applied in personal computers and electronic equipment.

A conventional structure of non-volatile memory has a stack-gate structure, including a tunneling oxide layer, a floating gate, a coupling dielectric layer, and a control gate disposed on a substrate in order. When a programming or erasing operation is performed on such a flash memory device, a suitable voltage is respectively applied to the source region, the drain region, and the control gate, such that electrons are injected into a floating gate, or electrons are pulled out from the floating gate.

In the programming and erasing operation of the non-volatile memory, a greater gate-coupling ratio (GCR) between the floating gate and the control gate generally means a lower operating voltage is needed for the operation, and the operating speed and the efficiency of the flash memory are significantly increased as a result. However, during programming or erase operations, electrons have to be injected into or pulled out of the floating gate through a tunneling oxide layer disposed under the floating gate, which often causes damages to the structure of the tunneling oxide layer and thus reduces the reliability of the memory device.

In order to increase the reliability of the memory device, an erase gate is adopted and incorporated into to the memory device, which is capable of pulling the electrons from the floating gate by applying a positive voltage to the erase gate. Thus, since the electrons in the floating gate is pulled out through a tunneling oxide layer disposed on the floating gate rather than through the tunneling oxide layer disposed under the floating gate, the reliability of the memory device is further improved.

However, even though the incorporation of the erase gate into the memory device can successfully improve the reliability of the memory device, the misalignment of the erase gate usually causes significant changes in the coupling ratio between the erase gate and the underlying floating gate, which increases the variation in required erase voltage and thus deteriorates the uniformity in electrical characteristics among the memory devices.

With an increasing demand for high-efficient memory device, there is still a need to provide an improved memory device which is capable of erasing the stored data efficiently.

SUMMARY OF THE INVENTION

The invention provides a non-volatile memory device which is capable of erasing the stored data efficiently with improved uniformity in electrical characteristics.

According to some embodiments of the present disclosure, a non-volatile memory device is disclosed. The non-volatile memory device includes at least one memory cell, and the at least one memory cell includes a substrate, an assist gate structure, a tunneling dielectric layer, a floating gate, and an upper gate structure. The assist gate structure is disposed on the substrate and includes a gate dielectric layer. The tunneling dielectric layer is disposed on the substrate at one side of the assist gate structure. The floating gate is disposed on the tunneling dielectric layer and includes two first top edges, two first sidewalls, and two second sidewalls. The first top edges are opposite each other and arranged along a first direction. The first sidewalls are opposite each other and arranged along the first direction, where the first sidewalls are connected to the first top edges respectively. The second sidewalls are opposite each other and arranged along a second direction different from the first direction. The upper gate structure covers the assist gate structure and the floating gate, where at least one of the first top edges of the floating gate is embedded in the upper gate structure. Portions of the upper gate structure extend beyond the second sidewalls of the floating gate in the second direction, and the portions of the upper gate structure are disposed above the substrate.

By using the non-volatile memory device according to the embodiments of the present disclosure, even if there is a misalignment between the upper gate structure and the underlying floating gate, the variation in required voltage being applied to the upper gate structure, such as ease voltage, would be reduced or even negligible.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
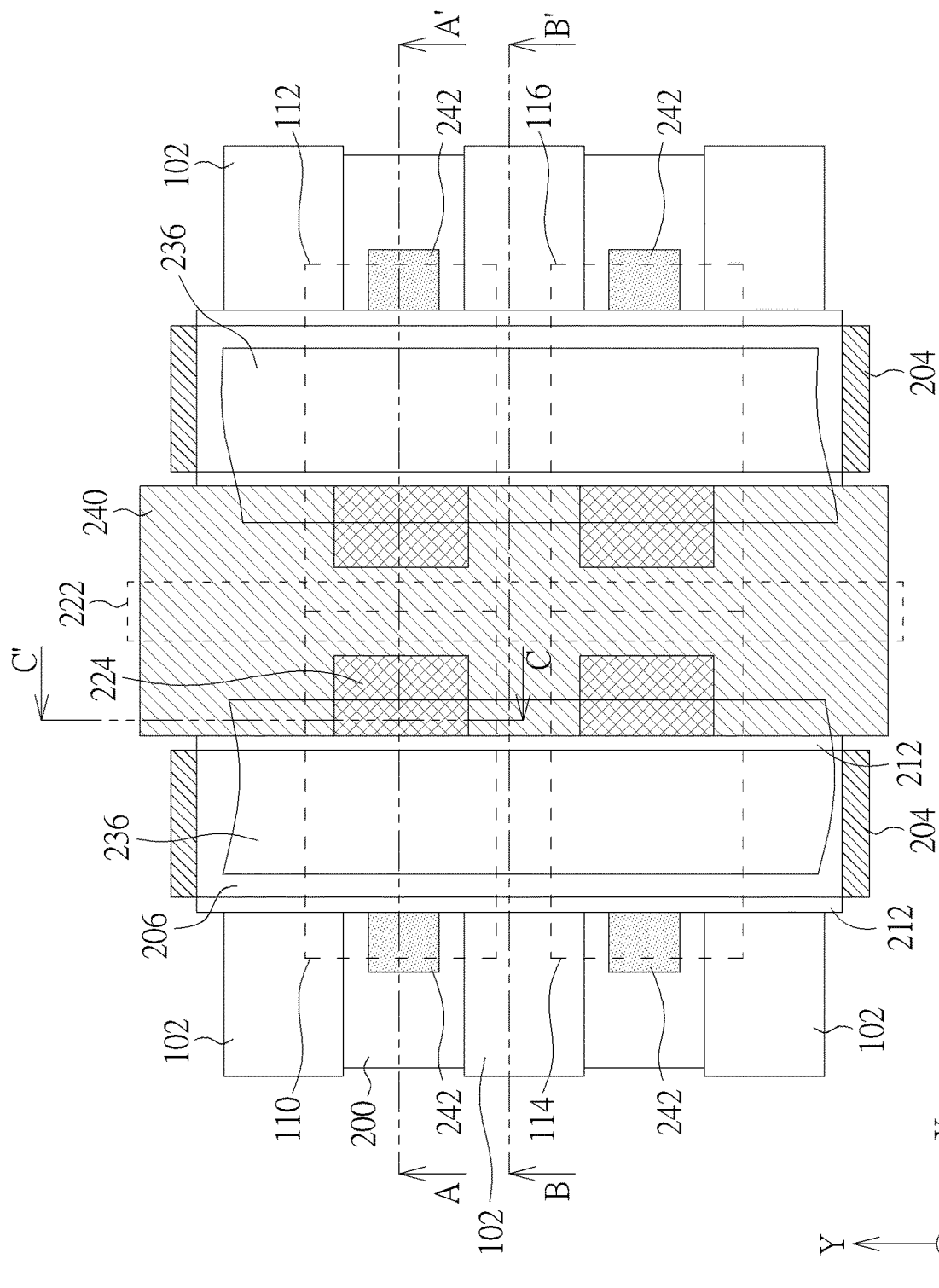
FIG. 1 is a schematic top view of a non-volatile memory device according to an embodiment of the disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "under", "on", "over", "above", "upper", "bottom", "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "under" other elements or features would then be oriented "above" and/or "over" the other elements or features. The apparatus may be otherwise oriented (rotated 90 degrees or at other orientations) and the spatially relative descriptors used herein may likewise be interpreted accordingly.

Although the disclosure is described with respect to specific embodiments, the principles of the disclosure, as defined by the claims appended herein, may obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

FIG. 1 is a schematic top view of a non-volatile memory device according to an embodiment of the present disclosure. Referring to FIG. 1, a non-volatile memory device can be a NOR flash memory device including at least one memory cell, such as four memory cells accommodated in the first, second, third, and fourth memory regions 110, 112, 114, and 116, respectively. The structures in the first memory region 110 and the second memory region 112 have a mirror image of each other, and the structures in the third memory region 114 and the fourth memory region 116 have a mirror image of each other. According to one embodiment of the present disclosure, the non-volatile memory device includes more than four of memory cells, and these memory cells can be arranged in an array with numerous rows and columns.

Referring to FIG. 1, the non-volatile memory device includes a substrate 200 and an isolation structure 102. The substrate 200 can be a semiconductor substrate, such as a silicon substrate or silicon-on-insulator (SOI) substrate, but not limited thereto. The isolation structure 102 can be made an insulating material and is used to define active areas of the memory cells.

Each of the memory cells includes a source region 222 and a drain region 242 disposed in the active area defined by the isolation structure 102. The source region 222 and the drain region 242 can be doped regions of the same conductivity type, such as n-type or p-type. The conductivity type of the source region 222 and the drain region 242 is different from the conductivity type of the substrate 200, or different from the conductivity type of a doped well (not shown) used to accommodate the source region 222 and the drain region 242. The source region 222 can be disposed at one end of the active area, and the drain region 242 can be arranged at another end of the active area. According to some embodiments of the present disclosure, the source region 222 is a continuous region extending along a Y-direction and shared by the memory cells in the same column.

Each memory cell can further include a stacked structure disposed on the substrate 200 and adjacent to the drain region 242. The stacked structure can extend along the Y-direction and shared by the memory cells in the same column. The stacked structure includes an assist gate 204, an insulation layer 206, and an upper gate structure 236, which are sequentially stacked upwards along a z-direction. The assist gate 204 can be made of conductive material such as poly silicon or metal, and assist gate 204 can act as a word line configured to turn on/off the channel regions of the memory cells arranged in the same column.

An isolation material layer 212 can be disposed on the sidewalls of the assist gate 204 and the insulation layer 206 in order to insulate the assist gate 204 from other conductive components. The isolation material layer 212 can be a single-layered, double-layered, or a multi-layered spacer disposed on each sidewall of the assist gate 204, but not limited thereto.

Each memory cell also includes a floating gate 224 disposed on the substrate 200 and adjacent to the source region 222. Thus, the floating gate 224 is disposed at one side of the assist gate 204, and the drain region 242 is disposed at another side of the assist gate 204. The floating gates 224 are made of conductive material, such as polysilicon or other semiconductor. The floating gates 224 are spaced apart from each other so that the electric current could not directly transmitted between the floating gates 224. Since the floating gates 224 are spaced apart from each other, each the floating gate 224 can be programed or erased independently to thereby determine the state of each memory cell, such as state "1" or state "0".

A middle structure 240 is disposed in the gap between adjacent floating gates 224 to surround the periphery of the floating gates 224. According to different requirements, the middle structure 240 can includes an insulating structure configured to prevent leakage current between adjacent floating gates 224, or the middle structure 240 can includes a control gate structure configured to make hot carriers (e.g. electrons) injected from the channel into the floating gate 224.

Figure 2:
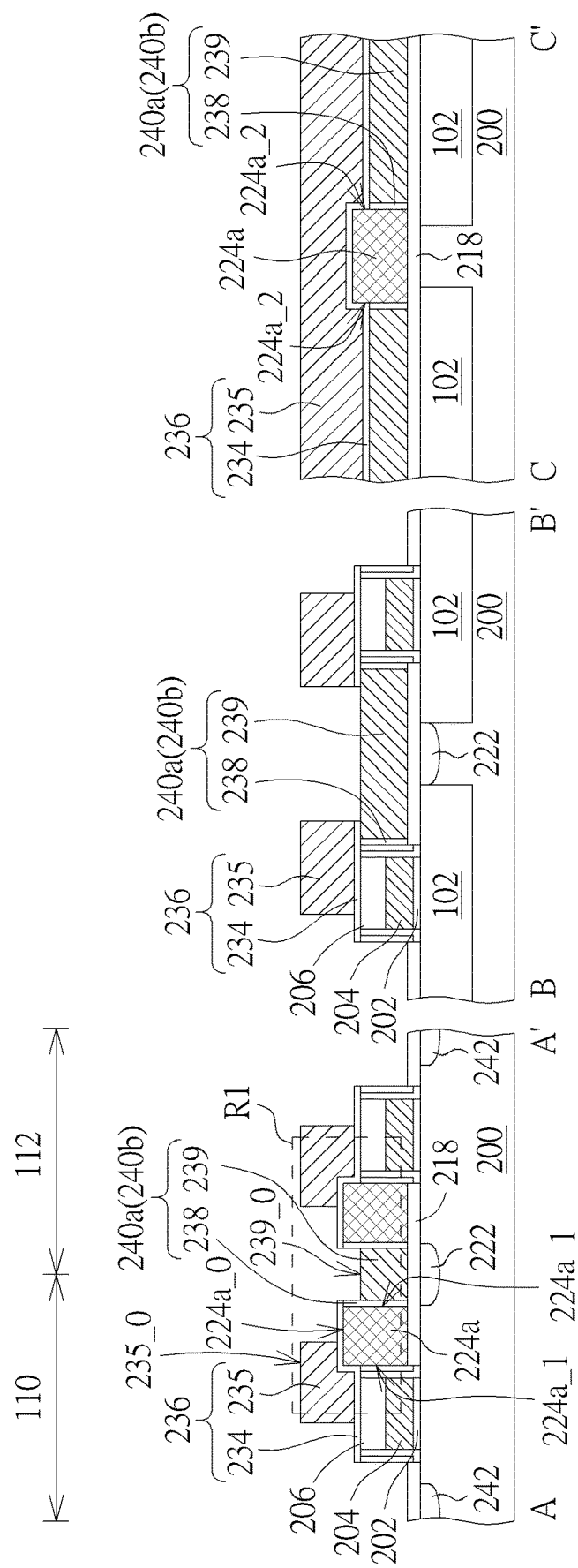
FIG. 2 is a schematic cross-sectional view of a non-volatile memory device corresponding to line A-A', line B-B' and line C-C' of FIG. 1 according to some embodiments of the present disclosure, where an erase gate covers a floating gate and a middle structure.

FIG. 2 is a schematic cross-sectional view of a non-volatile memory device corresponding to line A-A', line B-B' and line C-C' of FIG. 1 according to some embodiments of the present disclosure, where an erase gate covers a floating gate and a middle structure. Referring to view AA' of FIG. 2, the drain regions 242 are disposed in the first memory cell region 110 and the second memory region 112, respectively. The source region 222 is disposed at the boundary of the first memory cell region 110 and the second memory region 112.

For the memory cell in the first memory cell region 110, a gate dielectric layer 202 is disposed between the substrate 200 and the assist gate 204. By biasing the assist gate 204 at predetermined voltage, the carrier channel under the gate dielectric layer 202 can be turned on/off. The insulation layer 206 can be optionally disposed between the assist gate 204 and the upper gate structure 236 to prevent leakage current between them.

The upper gate structure 236 includes an upper gate dielectric layer 234 and an upper gate 235 stacked in sequence. The upper gate dielectric layer 234 can be made of dielectric layer which allows electrons to pass through it by Fowler-Nordheim (FN) tunneling mechanism. The upper gate 235 can be made of conductive material, such as polysilicon or metal. A top surface of the upper gate structure 236 is higher than a top surface of a floating gate 224a. Besides, the upper gate structure 236 can further extend toward the assist gate 204 so a portion of the upper gate structure 236 can extend beyond the sidewall of the assist gate 204 and thus covers a top surface 224a_0 of the floating gate 224a.

The floating gate 224a includes two opposite first sidewalls 224a_1 arranged along an X-direction. The first sidewall 224a_1 can be a vertical or inclined sidewall instead of a curved surface. The top surface 224a_0 of the floating gate 224a is a flat or slightly inclined surface instead of a curved surface. It should be noted that the floating gate 224a shown in FIG. 2 can be a rectangular floating gate since the contour of the floating gate 224a in view AA' is similar to a rectangle.

A tunneling dielectric layer 218 is disposed on the substrate 200 and at least between the substrate 200 and the floating gate 224a. The material of the tunneling dielectric layer 218 is, for instance, silicon oxide or other layers that allow hot electrons in the carrier channel to pass through it.

As disclosed above, the middle structure 240a can include the insulating structure, such as a middle base structure, or the middle structure 240b can include the control gate structure, such as the control gate structure (the control gate structure can cover the sidewalls 224a_1, 224a_2 of the floating gate 224a so as to provide extra coupling to the floating gate). The middle structure 240a, 240b (e.g. the middle base structure or the control gate structure) include a thin dielectric layer 238 and a middle layer 239. The thin dielectric layer 238 is disposed on the first sidewall 224a_1 of the floating gate 224a, and the middle layer 239 is disposed in the gap between adjacent floating gates 224a. According to some embodiments of the present disclosure, a top surface of the middle structure 240a, 240b is lower than the top surface top surface 224a_0 of the floating gate 224a.

According to different requirements, the upper gate structure 236 can act as an erase gate structure configured to pull the electrons out of the floating gate 224a through the top corner and/or top edge of the floating gate 224a, or act as not only the erase gate structure but also a control gate structure configured to attract hot carriers from the carrier channel into the floating gate 224a. In one aspect, the upper gate structure 236 can act only as the erase gate structure but not the control gate structure when the middle structure 240b is configured to act as the control gate structure. In another aspect, the upper gate structure 236 can act as both the erase gate structure and the control gate structure when the middle structure 240a is configured to act as the insulating structure.

Referring to view BB' of FIG. 2, the assist gate 204, the upper gate structure 236, and the middle structure 240a, 240b (e.g. the middle base structure or the control gate structure) are further disposed on the isolation structure 102. A portion of the middle structure 240a, 240b can be disposed between the upper gate structure 236 extending beyond the sidewall of the assist gate 204 and the isolation structure 102, or the portion of the middle structure 240a, 240b can be disposed between the upper gate structure 236 and the substrate 200.

Referring to view CC' of FIG. 2, the floating gate 224a includes two opposite second sidewalls 224a_2 arranged along a Y-direction. The second sidewall 224a_1 can be a vertical or inclined sidewall. An upper portion of a second sidewall 224a_2 of the floating gate 224a can be covered with the upper gate structure 236, and a lower portion of the second sidewall 224a_2 of the floating gate 224 can be covered with the middle structure 240a, 240b(e.g. the middle base structure or the control gate structure). According to some embodiments of the present disclosure, 60% to 95% of the surface area of each second sidewall 224a_2 is covered with the middle layer 239, and thus the contact area between the upper gate structure 236 and the second sidewall 224a_2 is small. Besides, because of the presence of the middle structure 240a, 240b, a bottom surface of the upper gate structure 236 extending beyond the second sidewall 224a_2 of the floating gate 224 can be spaced apart from the isolation structure 102, the tunneling dielectric layer 218, and the substrate 200.

According to some embodiments of the present disclosure, the non-volatile memory device can further include other components, such as vias, bit lines, interlayer dielectric and so forth, and the structure shown in FIG. 2 can be further modified based on actual requirements.

Figure 3:
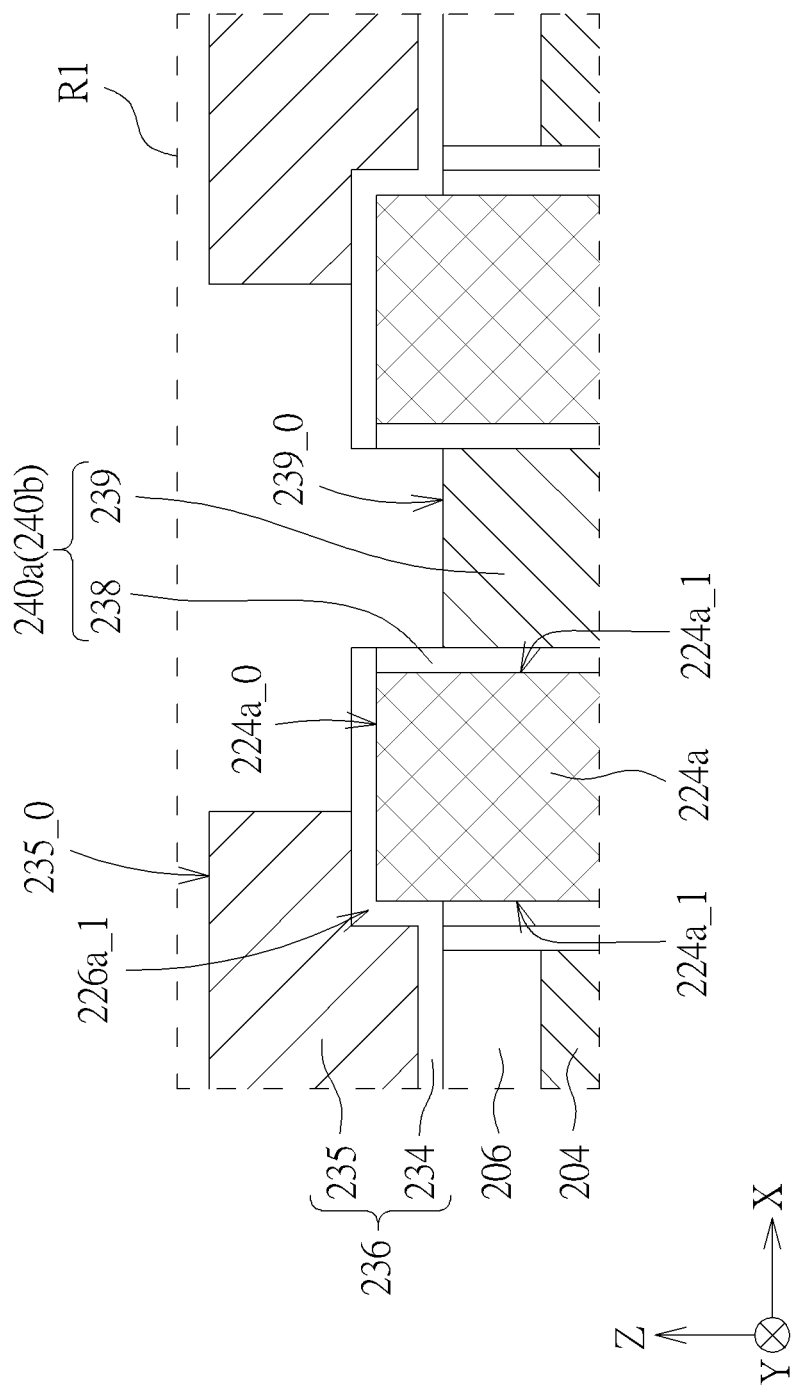
FIG. 3 is an enlarged cross-sectional view of a region R1 of a non-volatile memory device shown in FIG. 2 according to some embodiments of the present disclosure.

FIG. 3 is an enlarged cross-sectional view of a region R1 of a non-volatile memory device shown in FIG. 2 according to some embodiments of the present disclosure. Referring to FIG. 3, the floating gate 224a includes two first top edges 226a_1 which are opposite each other and arranged along a first direction, such as an X-direction. By biasing the upper gate structure 236, most of the electrons stored in the floating gate 224a can be pulled out through the first top edges 226a_1 embedded in the upper gate structure 236. The first sidewalls 224a_1 of the floating gate 224a arranged along the first direction such as an X-direction are connected to the first top edges 226a_1, respectively. The second sidewalls (not shown) of the floating gate 224a are arranged along a second direction such as a Y-direction, and covered with the dielectric middle layer 239 made of dielectric material or covered with the conductive middle layer 239 acting as the control gate (i.e. coupling gate). Since 65% to 95% of the second sidewalls (i.e. the sidewalls perpendicular to a Y-direction) are covered with the middle layer 239, and both first top edges 226a_1 are higher than the lowest bottom surface of the upper gate 235, the coupling ratio between the upper gate structure 236 and the underlying floating gate 224a would not be changed significantly even if there is a misalignment between the upper gate 235 and the floating gate 224a. Thus, the uniformity in electrical characteristics among the non-volatile memory devices can be improved.

In the following paragraphs, an alternative embodiment of the present disclosure are further described, and only the main differences between the embodiments are described for the sake of brevity.

Figure 4:
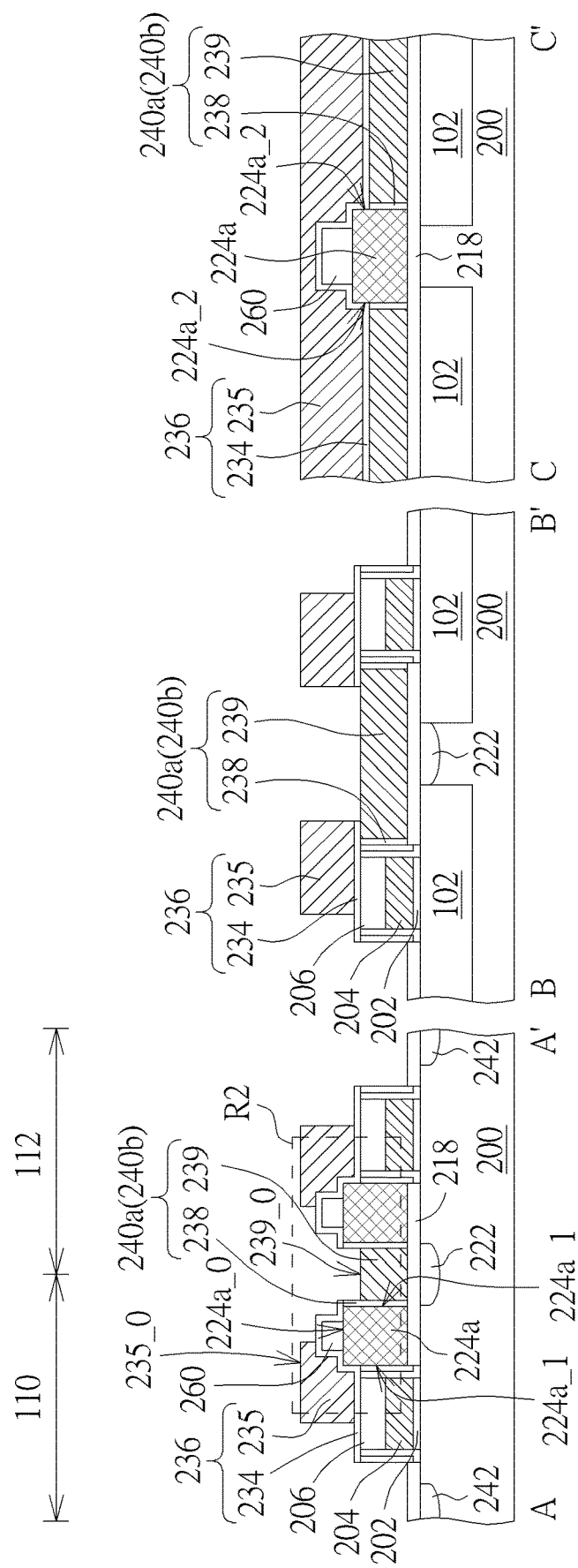
FIG. 4 is a schematic cross-sectional view of a non-volatile memory device corresponding to line A-A', line B-B' and line C-C' of FIG. 1 according to alternative embodiments of the present disclosure, where a top dielectric layer covers a floating gate.

FIG. 4 is a schematic cross-sectional view of a non-volatile memory device corresponding to line A-A', line B-B' and line C-C' of FIG. 1 according to alternative embodiments of the present disclosure, where a top dielectric layer covers a floating gate. Referring to view AA' of FIG. 4, the structure shown in FIG. 4 is analogous to the structure shown in FIG. 2, the main difference is that a top dielectric layer 260 is further disposed on the top surface 224a_0 of the floating gate 224a. In view AA' of FIG. 4, the top dielectric layer 260 would not extend beyond the first sidewalls 224a_1 of the floating gate 224a. In view CC' of FIG. 4, the top dielectric layer 260 would also not extend beyond the second sidewalls 224a_2 of the floating gate 224a.

Figure 5:
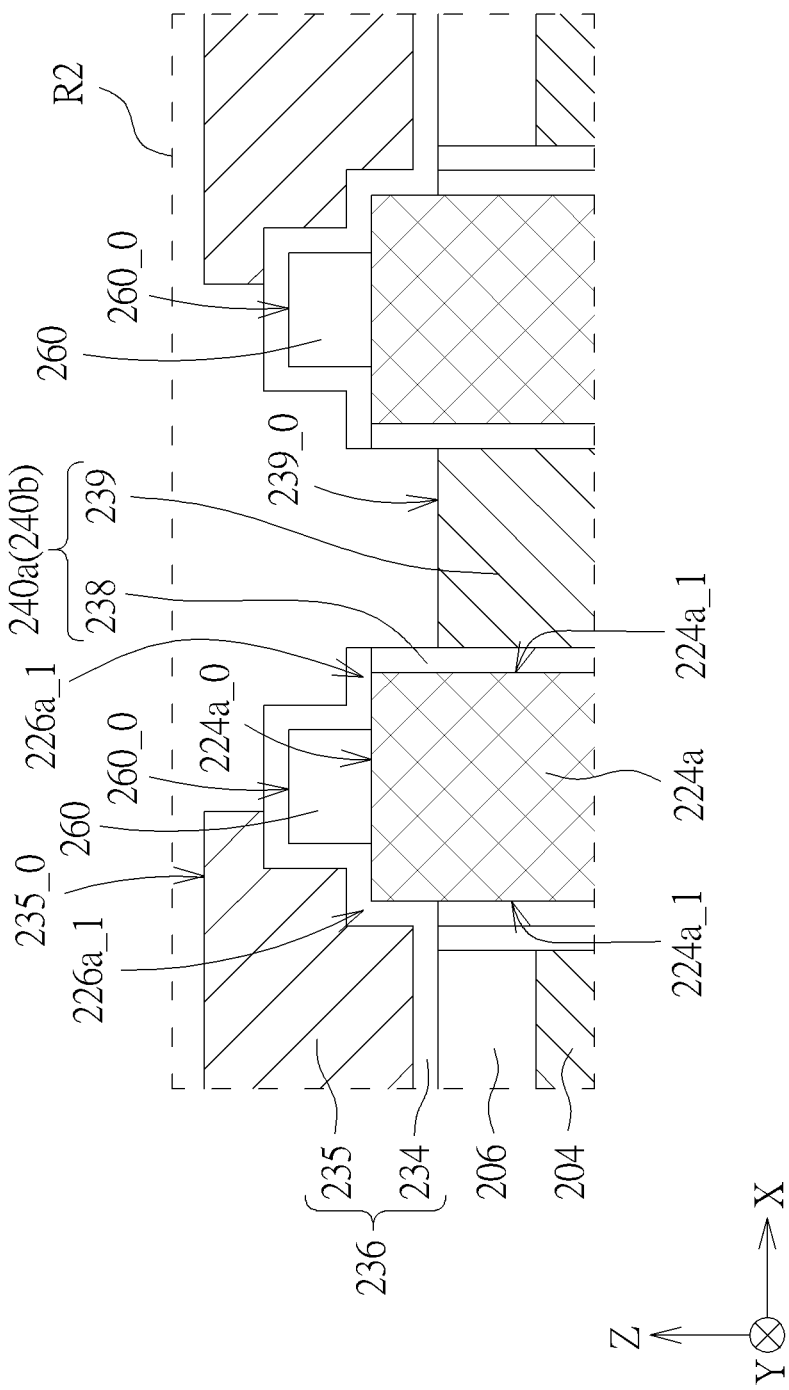
FIG. 5 is an enlarged cross-sectional view of a region R2 of a non-volatile memory device shown in FIG. 4 according to some embodiments of the present disclosure.

FIG. 5 is an enlarged cross-sectional view of a region R2 of a non-volatile memory device shown in FIG. 4 according to some embodiments of the present disclosure. Referring to FIG. 5, the first top edges 226a_1 of the floating gate 224a are not covered with the top dielectric layer 260 so that at least one of the first top edges 226a_1 of the floating gate 224a can still be in direct contact with the upper gate structure 236. In other word, as viewed from a top-down perspective, the area of the top surface 260_0 of the top dielectric layer 260 is less than the area of a top surface 224a_0 of the floating gate 224a. Because of the presence of the top dielectric layer 260, portions of the upper gate structure 236 disposed above the floating gate 224a can be disposed away from the top surface 224a_0 of the floating gate 224a. Thus, the coupling ratio induced by the portions of the upper gate structure 236 disposed above the top dielectric layer 260 can be reduced, thereby improving the uniformity in electrical characteristics among the non-volatile memory devices.

Figure 6:
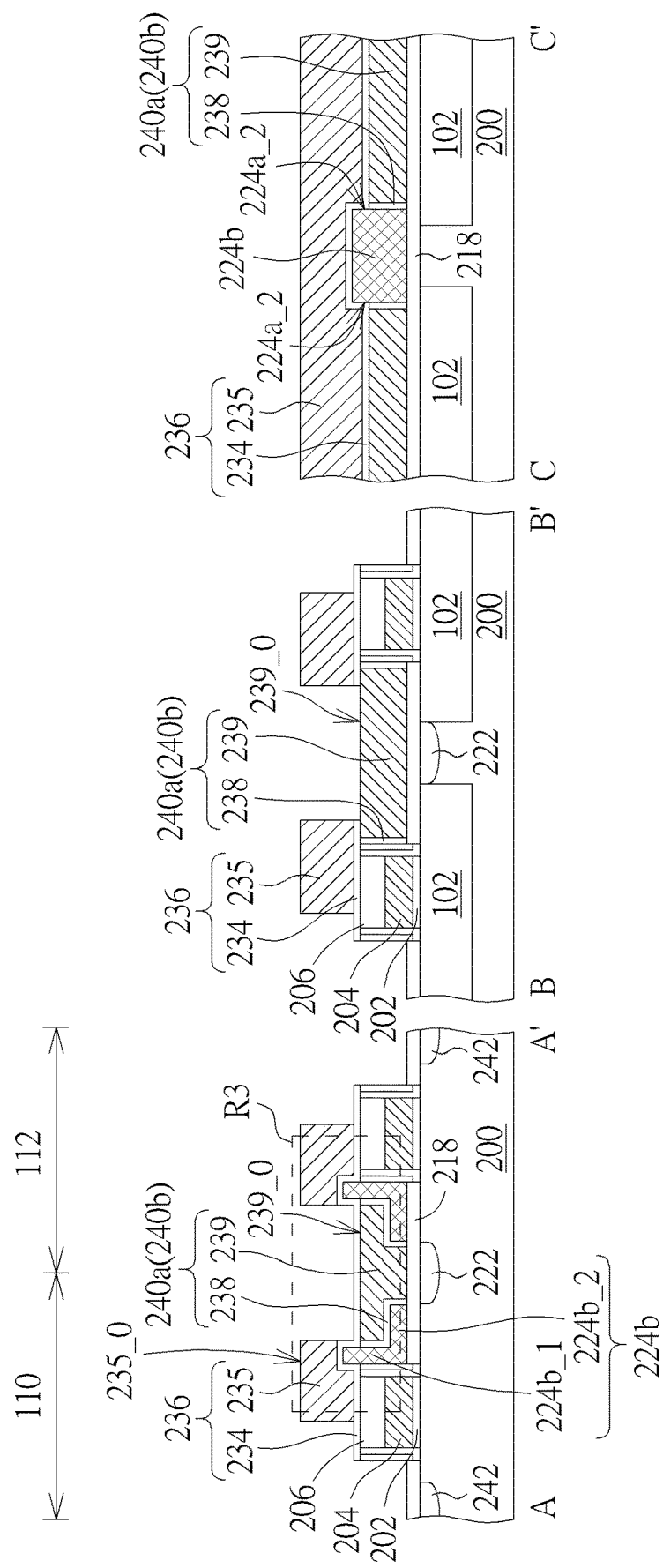
FIG. 6 is a schematic cross-sectional view of a non-volatile memory device corresponding to line A-A', line B-B' and line C-C' of FIG. 1 according to alternative embodiments of the present disclosure, where a floating gate is an L-shaped floating gate.

FIG. 6 is a schematic cross-sectional view of a non-volatile memory device corresponding to line A-A', line B-B' and line C-C' of FIG. 1 according to alternative embodiments of the present disclosure, where a floating gate is an L-shaped floating gate. Referring to view AA' of FIG. 6, the structure shown in FIG. 6 is analogous to the structure shown in FIG. 2, the main difference is that a floating gate 224b is an L-shaped floating gate including a vertical portion 224b_1 and a horizontal portion 224b_2. The vertical portion 224b_1 and the horizontal portion 224b_2 can have substantially the same thickness and composition. The top surface of the vertical portion 224b_1 is higher than a top surface of the middle structure 240a, 240b (i.e. the middle base structure or the control gate structure), or higher than a top surface 239_0 of the middle layer 239. The horizontal portion 224b_2 is covered with the middle layer 239.

Figure 7:
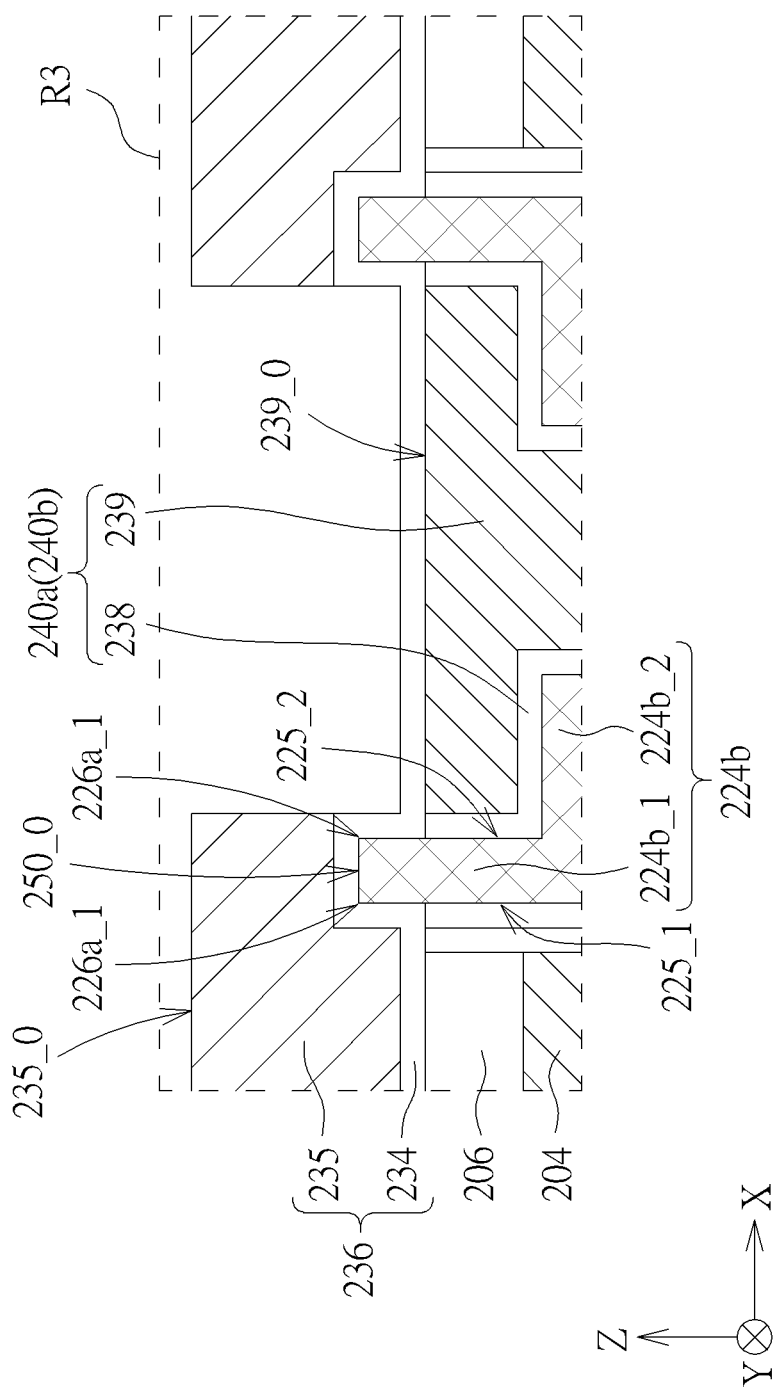
FIG. 7 is an enlarged cross-sectional view of a region R3 of a non-volatile memory device shown in FIG. 6 according to some embodiments of the present disclosure.

FIG. 7 is an enlarged cross-sectional view of a region R3 of a non-volatile memory device shown in FIG. 6 according to some embodiments of the present disclosure. Referring to FIG. 7, the floating gate 224b includes an inner surface 225_1 and an outer surface 225_2 opposite the inner surface 225_1. The outer surface 225_2 faces the middle structure 240a, 240b. The vertical portion 224b_1 of the floating gate 224b includes a top surface 225_0 and two opposite first top edges 226a_1 arranged along the first direction, such as an X-direction. The width of the top surface 225_0 in X-direction is 1/20 to 1/3 of the width of a bottom surface of the floating gate 224b. One or both of the first top edges 226a_1 can be covered with the upper gate structure 236. Because the width of the top surface 225_0 in X-direction is much less than the width of the bottom surface of the floating gate 224b, and 65% to 95% of the second sidewalls (i.e. the sidewalls perpendicular to a Y-direction) of the floating gate 224b are covered with the middle layer 239, the coupling ratio between the upper gate structure 236 and the underlying floating gate 224b would not be changed significantly even if there is a misalignment between the upper gate 235 and the floating gate 224b. Thus, the uniformity in electrical characteristics among the non-volatile memory devices can be improved.

Figure 8:
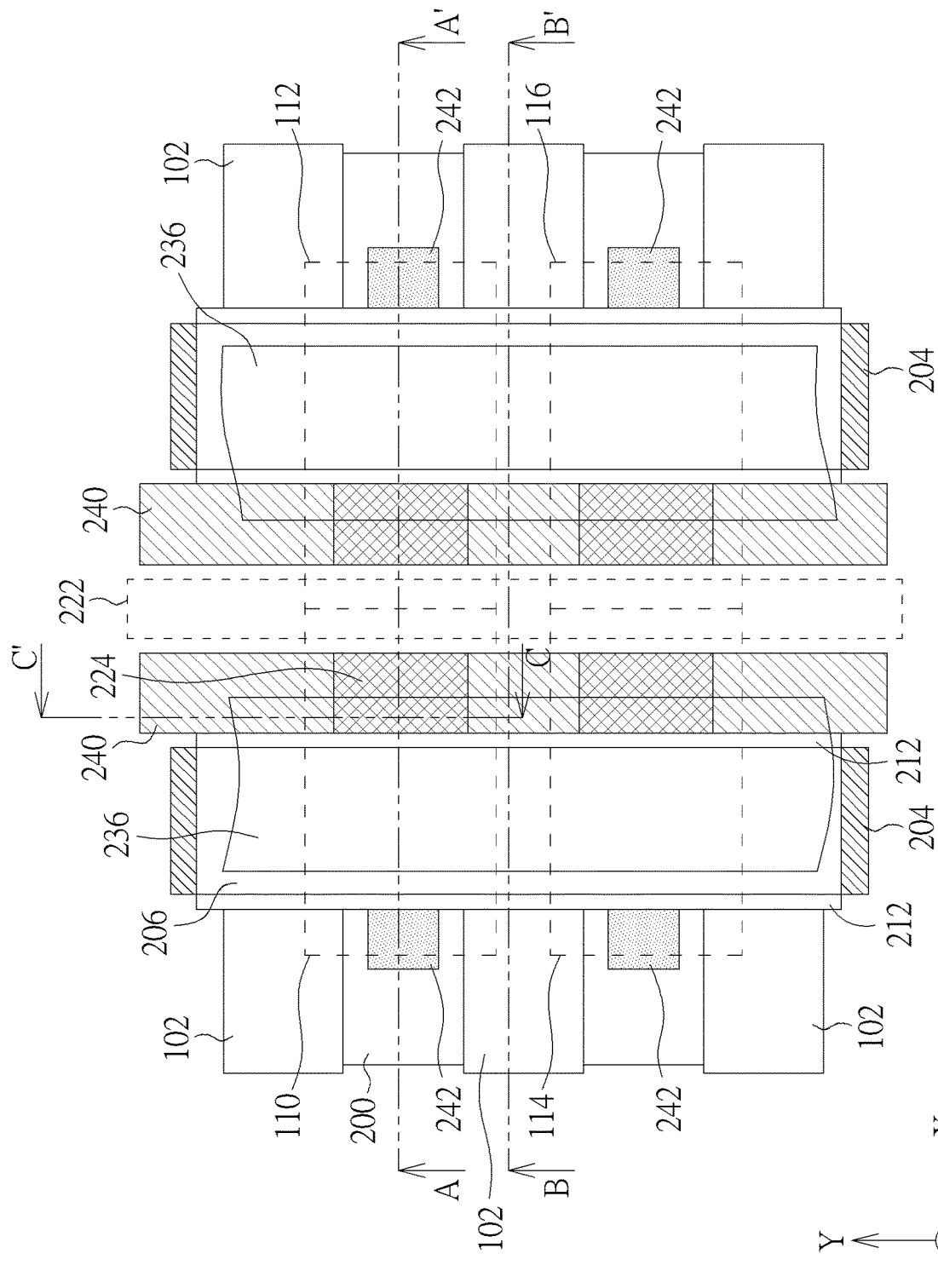
FIG. 8 is a schematic top view of a non-volatile memory device according to alternative embodiments of the disclosure.

FIG. 8 is a schematic top view of a non-volatile memory device according to alternative embodiments of the disclosure. Referring to FIG. 8, the structure shown in FIG. 8 is analogous to the structure shown in FIG. 1, the main difference is that the floating gate 224 is the L-shaped floating gate instead of the rectangular floating gate as taken along line AA', and the source region 222 of the non-volatile memory device is not covered with the middle structure 240. Thus, the middle structure 240 in the first cell region 110 is separated from the middle structure 240 in the second cell region 112, and the middle structure 240 in the third cell region 114 is separated from the middle structure 240 in the fourth cell region 116.

Figure 9:
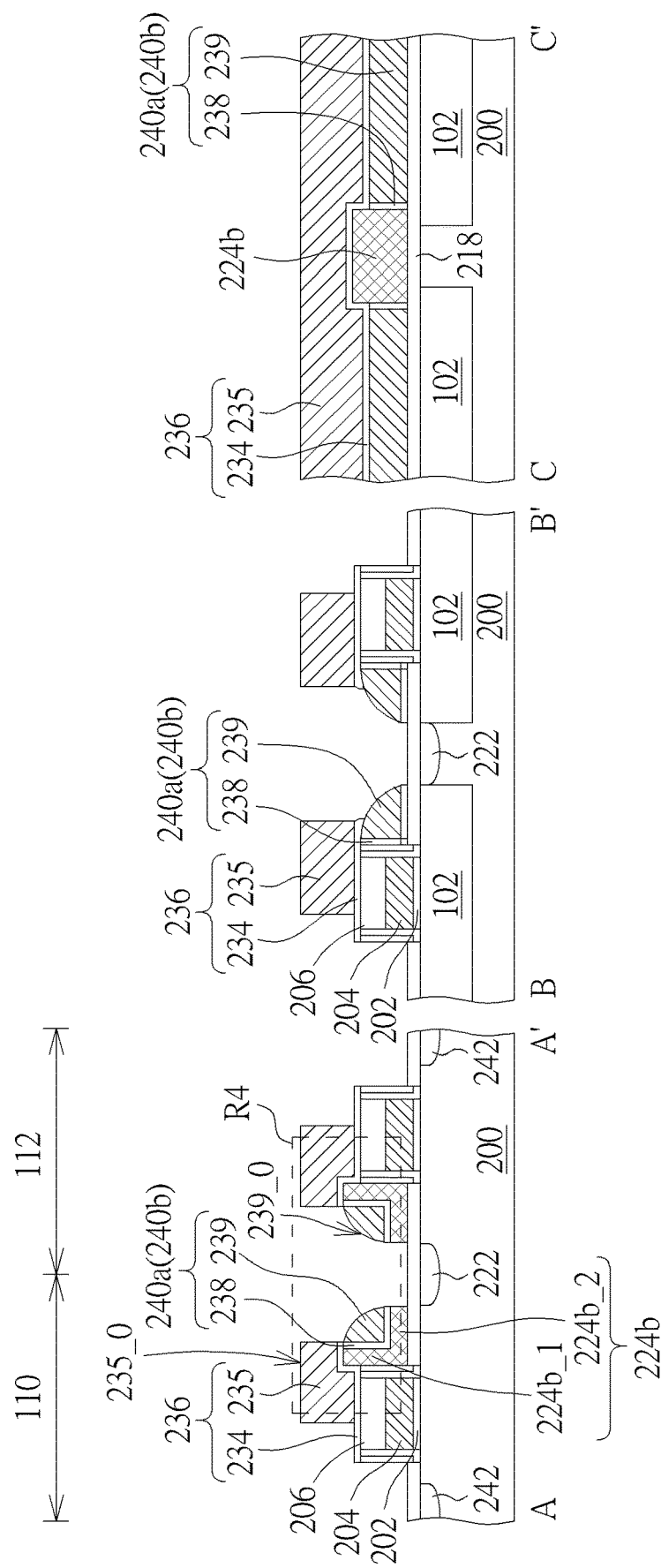
FIG. 9 is a schematic cross-sectional view of a non-volatile memory device corresponding to line A-A', line B-B' and line C-C' of FIG. 8 according to some alternative embodiments of the present disclosure, where a source region is exposed from a middle structure.

FIG. 9 is a schematic cross-sectional view of a non-volatile memory device corresponding to line A-A', line B-B' and line C-C' of FIG. 8 according to some alternative embodiments of the present disclosure, where a source region is exposed from a middle structure. Referring to view AA' of FIG. 9, the floating gate 224b is the L-shaped floating gate analogous to the floating gate 224b shown in FIG. 6. The top surface of the horizontal portion 224b_2 of the floating gate 224b is covered with the middle structure 240a, 240b, and a distal end of the horizontal portion 224b_2 away from the floating gate 224b is exposed from the middle structure 240a, 240b. Besides, the middle structure 240a, 240b has a curved surface.

Referring to view BB' of FIG. 9, a portion of the upper gate structure 236 covers the curved surface of the middle structure 240a, 240b and thus has a curved bottom surface.

Figure 10:
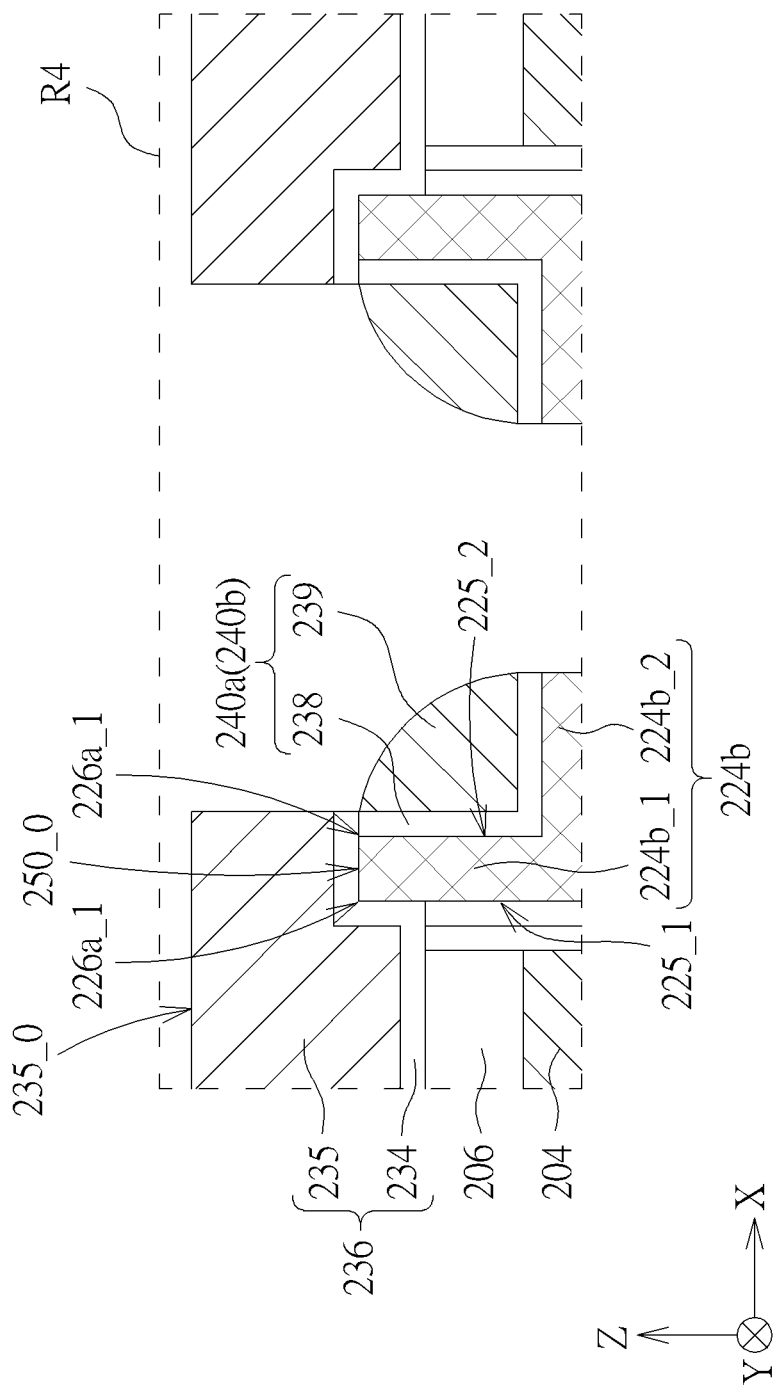
FIG. 10 is an enlarged cross-sectional view of a region R4 of a non-volatile memory device shown in FIG. 9 according to some alternative embodiments of the present disclosure.

FIG. 10 is an enlarged cross-sectional view of a region R4 of a non-volatile memory device shown in FIG. 9 according to some alternative embodiments of the present disclosure. Referring to FIG. 10, analogous to the structure shown in FIG. 7, the vertical portion 224b_1 of the floating gate 224b includes the top surface 225_0 and two opposite first top edges 226a_1 arranged along the first direction, such as an X-direction. The width of the top surface 225_0 in X-direction is $\frac{1}{20}$ to $\frac{1}{3}$ of the width of a bottom surface of the floating gate 224b. One or both of the first top edges 226a_1 can be covered with the upper gate structure 236. Besides, the middle structure 240a, 240b covers not only the inner surface 225_2 of the floating gate 224b but also the second sidewalls (not shown) of the floating gate 224b arranged along Y-direction. According to some embodiments of the present disclosure, the uppermost vertex of the middle structure 240a, 240b and the top surface 225_0 of the floating gate 224b can be substantially at the same height. Because the width of the top surface 225_0 in X-direction is much less than the width of the bottom surface of the floating gate 224b, and over 95% of the inner surface 225_2 and over 95% of the second sidewalls (i.e. the sidewalls perpendicular to a Y-direction) of the floating gate 224b are covered with the middle structure 240a, 240b, the coupling ratio between the upper gate structure 236 and the underlying floating gate 224b would not be changed significantly even if there is a misalignment between the upper gate 235 and the floating gate 224b. Thus, the uniformity in electrical characteristics among the non-volatile memory devices can be improved.

FIG. 11 to FIG. 14 are cross-sectional views at various stages of manufacture of a method for manufacturing the non-volatile memory device of FIGS. 1-3 according to some embodiment of the invention. In FIG. 11 to FIG. 14, views AA', BB' and CC' correspond to the lines A-A', B-B', and line C-C' of FIG. 1, respectively.

Figure 11:
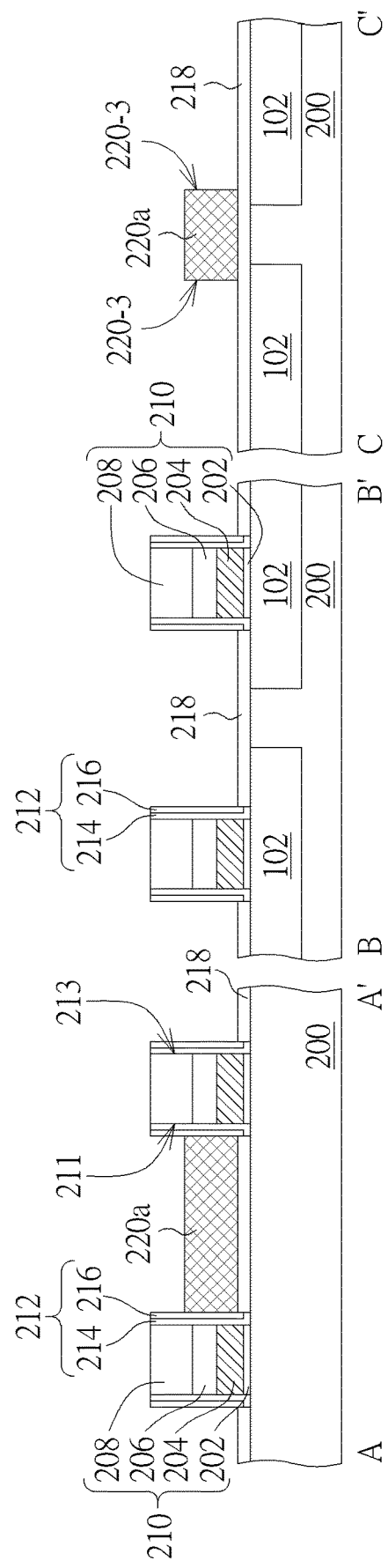
FIG. 11 to FIG. 14 are cross-sectional views at various stages of manufacture of a method for manufacturing the non-volatile memory device of FIGS. 1-3 according to some embodiment of the invention.

Referring to view AA', view BB' and view CC' of FIG. 11, a structure formed at this manufacturing stage includes at least a substrate 200, at least one stacked structure 210, an isolation material layer 212, a tunneling dielectric layer 218, and a patterned conductive layer 220a.

According to some embodiments of the present disclosure, the substrate 200 may be a semiconductor substrate with suitable conductivity type, such as p-type or n-type. The composition of the substrate 200 may include silicon, germanium, gallium nitride or other suitable semiconductor materials, but not limited thereto.

At least one stacked structure 210 is on the substrate 200. For example, two stacked structures 210 are disposed on the substrate 200 and laterally spaced apart from each other. Each of the stacked structures 210 includes a gate dielectric layer 202, an assist gate 204, an insulation layer 206, and a sacrificial layer 208 stacked in order. Each of the stacked structures 210 include a first sidewall 211 and a second sidewall 211, and the first sidewalls 211 of the stacked structures 210 faces toward each other. The assist gate 204 is made of conductive material, and the assist gate 204 is configured to turn on/off of a carrier channel in the substrate 200 underlying the assist gate 204 when applied with a suitable voltage. The insulation layer 206 is made of insulating material, such as silicon oxide, silicon oxide, or silicon oxynitride, but not limited thereto, which is used to electrically isolate the assist gate 204 from layers disposed above the assist gate 204. The sacrificial layer 208 is an uppermost layer in the stacked structure 210, which is a temporary layer configured to be removed before the subsequent process of forming a gate structure, such as an upper gate structure, on the assist gate 204.

The isolation material layer 212 is formed on the sidewalls 211, 213 of the stacked structures 210. The material of the isolation material layer 212 is, for instance, silicon oxide/silicon nitride/silicon oxide or silicon nitride/silicon oxide. The forming method of the isolation material layer 212 includes, for instance, first forming a dielectric layer 214 and a dielectric layer 216 covering each of the stacked structures 210 on the substrate 200 in order, and then removing a portion of the dielectric layer 214 and the dielectric layer 216 to form the isolation material layer 212 on the sidewall of each of the stacked structures 210. The material of the dielectric layer 214 is, for instance, silicon nitride, and the material of the dielectric layer 216 is, for instance, silicon oxide. The forming method of the dielectric layer 214 and the dielectric layer 216 is, for instance, a chemical vapor deposition method. The method of removing a portion of the dielectric layer 214 and the dielectric layer 216 is, for instance, an anisotropic etching method.

The tunneling dielectric layer 218 is formed on the substrate 200 at least between the stacked structures 210 or further at both sides of the stacked structures 210. The material of the tunneling dielectric layer 218 is, for instance, silicon oxide, or other layers that allow hot electrons pass through it by tunneling effect. The forming method of the tunneling dielectric layer 218 is, for instance, a thermal oxidation or deposition method, but not limited thereto.

Referring to view AA' of FIG. 11, the patterned conductive layer 220a is formed in a gap between the stacked structures 210 and covers the sidewall 211 of each of the stacked structures 210. The method of forming the patterned conductive layer 220a may include the following steps. First, a conductive layer (not shown) is formed on the substrate 200. The material of the conductive layer is, for instance, doped polysilicon, polycide or other suitable conductive material. When the material of the conductive layer is doped polysilicon, its forming method includes, for instance, performing an ion implantation step after an undoped polysilicon layer is formed via a chemical vapor deposition method; or performing a chemical vapor deposition method with an in-situ dopant implantation method. Then, an etching process, such as an anisotropic etching process or an etch-back process, is performed to etch the conductive layer. As a result, the conductive layer can be patterned to form a plurality of conductive blocks (not shown) arranged along X-direction. The conductive blocks, at this stage of manufacture, cover both the sidewall 211 and the sidewall 213 of each of the stacked structures 210. Then, the conductive blocks disposed adjacent to the sidewalls 213 of the stacked structures 210 are removed by photolithography and etching processes. In this way, only the patterned conductive layer 220a disposed on the first sidewalls 211 of the stacked structure 210 remains. Besides, the patterned conductive layer 220a disposed on the first sidewall 211 of the stacked structure 210 can have a rectangular contour as viewed from a top-down perspective. The height of the patterned conductive layer 220a can be properly controlled by performing an etching back process.

Figure 12:
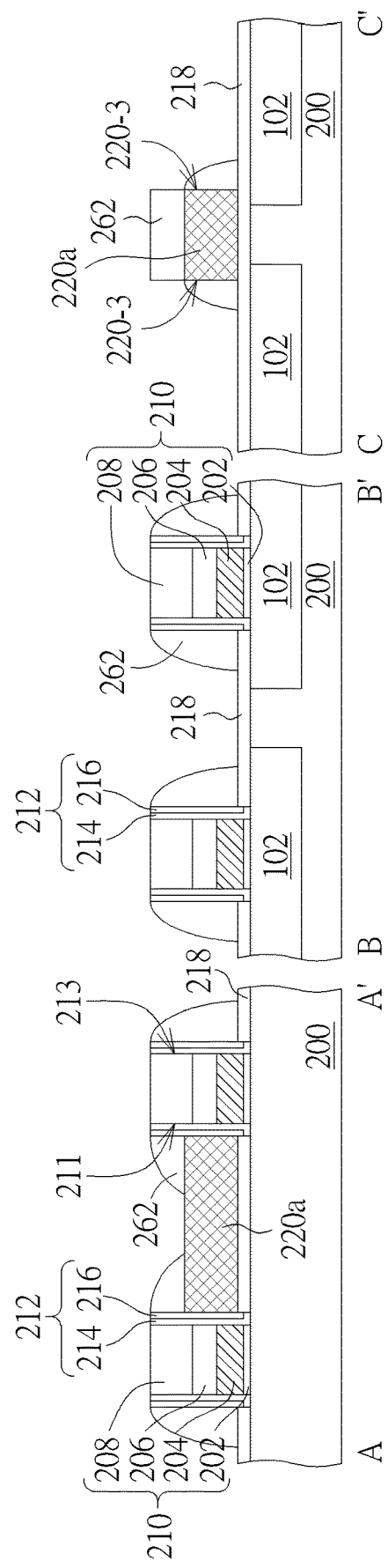

Referring to view BB' of the FIG. 12, the patterned conductive layer does not exist in the predetermined regions on the substrate 200. Referring to view CC' of the FIG. 12, the patterned conductive layer 220a can have sidewalls 220_3 which are vertical or inclined sidewalls.

FIG. 12 is a schematic cross-sectional view at a manufacturing stage subsequent to FIG. 11 according to some embodiments of the present disclosure, where spacers are formed on a patterned conductive layer. After the structure shown in FIG. 11 is fabricated, a plurality of spacers 262 made of dielectric material are formed to cover the top surface of the patterned conductive layer 220a and the sidewalls 211, 213 of the stacked structures 210.

Figure 13:
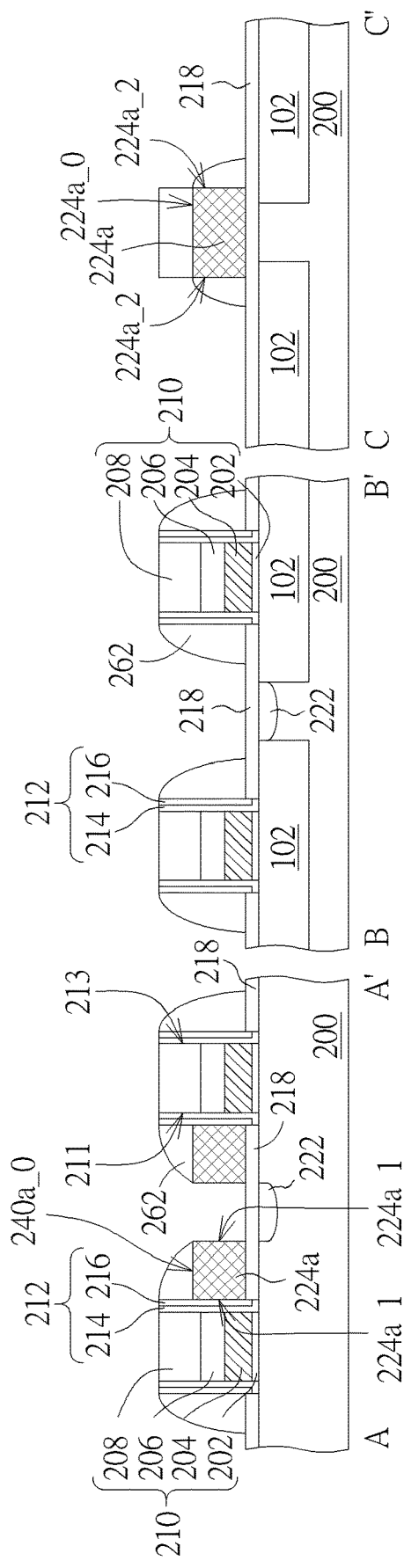

FIG. 13 is a schematic cross-sectional view at a manufacturing stage subsequent to FIG. 12 according to some embodiments of the present disclosure, where floating gates are formed. After the structure shown in FIG. 12 is fabricated, an etching process is performed on the patterned conductive layer using the spacers 262 as etch masks. Thus, the patterned conductive layer is further patterned to form a plurality of floating gates 224a adjacent to the first sidewalls 211 of the stacked structure 210. Afterwards, a source region 222 is formed in the substrate 200 between two adjacent floating gates 224a. The method of forming the source region 222 includes, for instance, performing an ion implantation process using the spacers 262 as etch masks. The implanted dopant can be an n-type or p-type dopant as decided according to the requirements of the device. The source region 222 may be regarded as a shared source region since the source region 222 is shared by two adjacent memory cells. Afterwards, the spacers 262 can be stripped.

Figure 14:
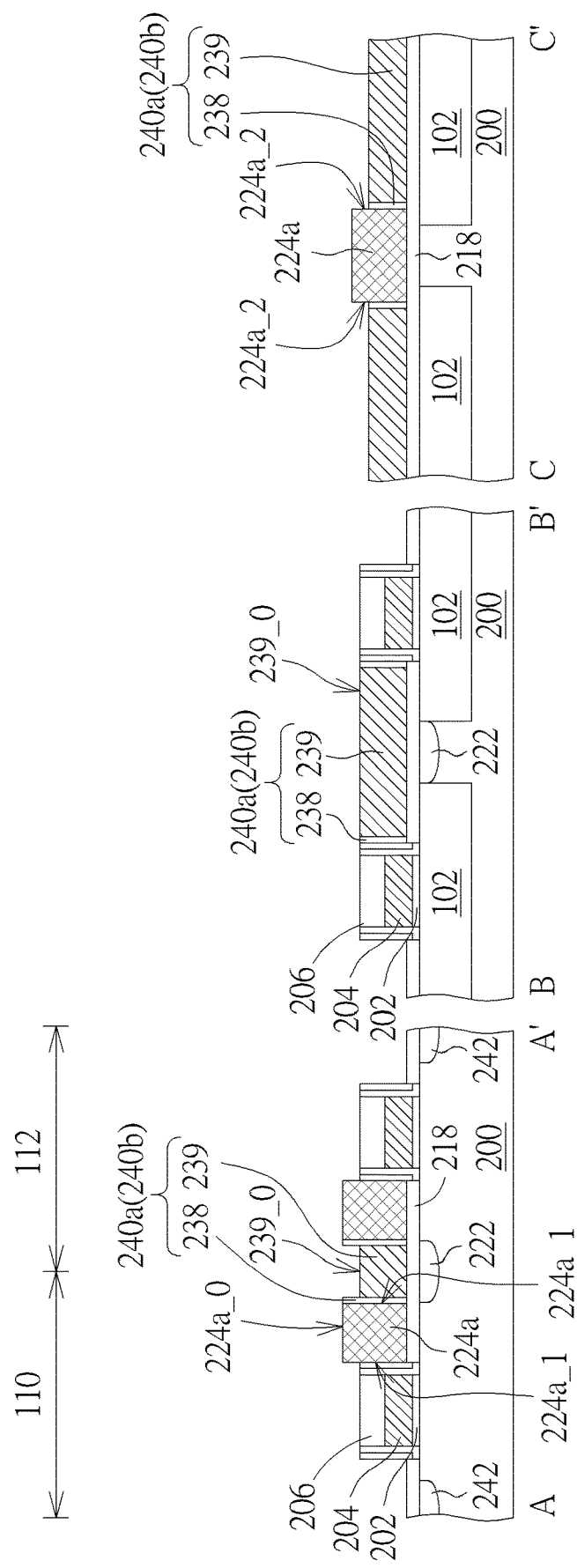

FIG. 14 is a schematic cross-sectional view at a manufacturing stage subsequent to FIG. 13 according to some embodiments of the present disclosure, where a middle structure is formed in a gap between two adjacent floating gates. After the structure shown in FIG. 13 is fabricated, referring to view AA' of FIG. 14, a middle structure 240a, 240b can be formed in a gap between the two adjacent floating gates 224a. The middle structure 240a, 240b includes a thin dielectric layer 238 and a middle layer 239. The thin dielectric layer 238 is disposed on the first sidewall 224a_1 of the floating gate 224a, and the middle layer 239 is disposed in the gap between adjacent floating gates 224a. The thickness of the thin dielectric layer 238 (i.e. in an X-direction) is less than the thickness of the middle layer 239 (i.e. in a Z-direction). For example, the ratio of the thickness of the thin dielectric layer 238 and the middle layer 239 is 0.01 to 0.2. According to some embodiments of the present disclosure, a top surface of the middle structure 240a, 240b is lower than the top surface top surface 224a_0 of the floating gate 224a.

Referring to view CC' of FIG. 14, the floating gate 224a includes two opposite second sidewalls 224a_2 arranged along a Y-direction. Each second sidewall 224a_1 can be a vertical or inclined sidewall. An upper portion of the second sidewall 224a_2 of the floating gate 224a can be covered with the subsequently formed upper gate structure, and a lower portion of the second sidewall 224a_2 of the floating gate 224 is covered with the middle structure 240a, 240b (e.g. the middle base structure or the control gate structure). According to some embodiments of the present disclosure, 60% to 95% of the surface area of each second sidewall 224a_2 is covered with the middle layer 239, and thus the contact area between the subsequently formed upper gate structure and the second sidewall 224a_2 is small. Besides, because of the presence of the middle structure 240a, 240b, a bottom surface of the upper gate structure 236 extending beyond the second sidewall 224a_2 of the floating gate 224 can be spaced apart from the isolation structure 102, the tunneling dielectric layer 218, and the substrate 200.

Afterwards, the upper gate structure and other components may be formed so as to obtain a non-volatile memory device similar to the structure shown in FIGS. 1-3.

Figure 15:
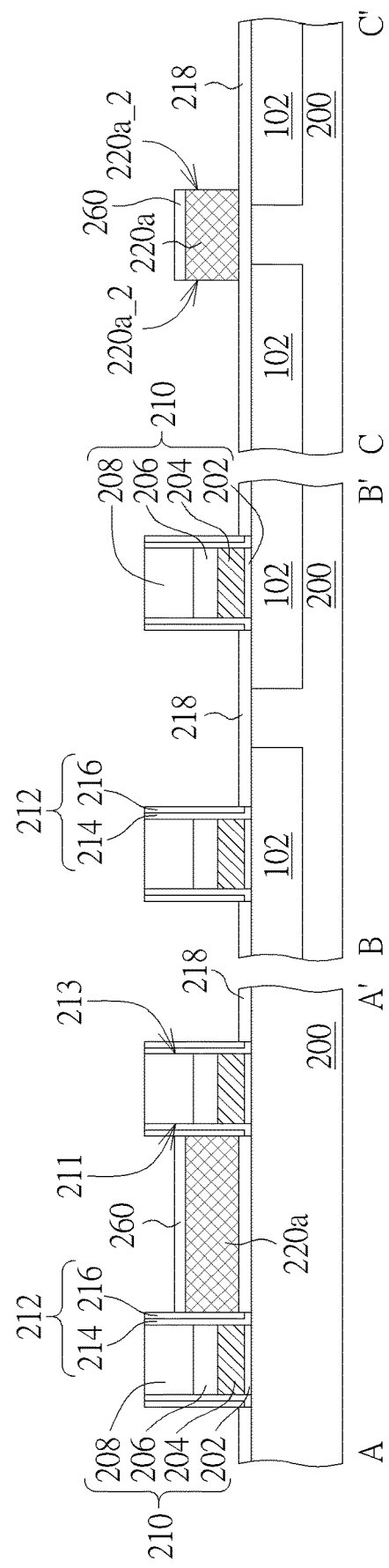
FIG. 15 to FIG. 17 are cross-sectional views at various stages of manufacture of a method for manufacturing the non-volatile memory device of FIGS. 4-5 according to some embodiment of the invention.
Figure 16:
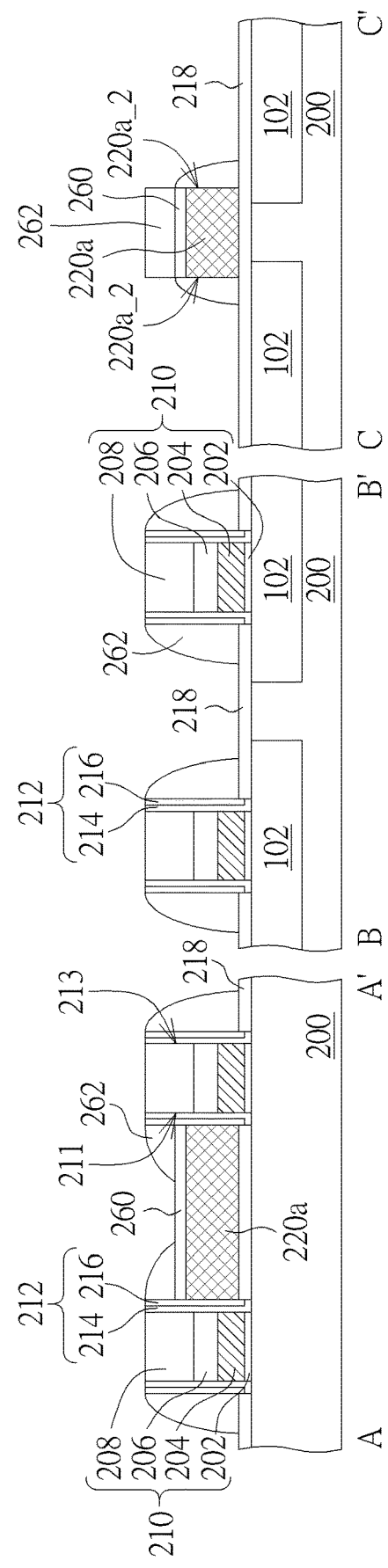
Figure 17:
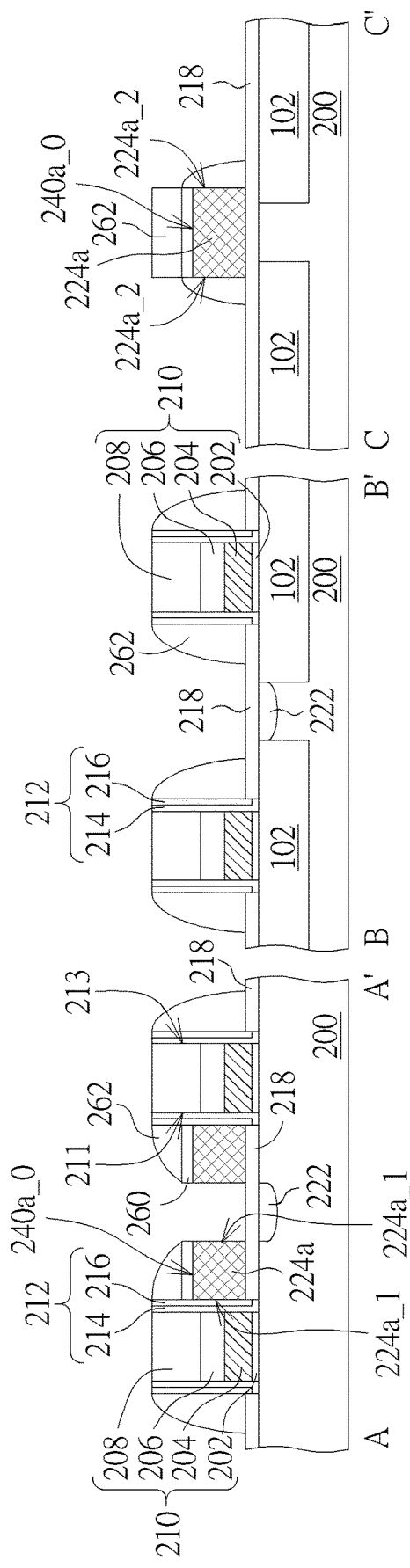

FIG. 15 to FIG. 17 are cross-sectional views at various stages of manufacture of a method for manufacturing the non-volatile memory device of FIGS. 4-5 according to some embodiment of the invention. In FIG. 15 to FIG. 17, view AA', view BB' and view CC' correspond to the line A-A', line B-B', and line C-C' of FIG. 1, respectively. Besides, since the manufacturing processes of the embodiments shown in FIG. 15 to FIG. 17 are similar to the manufacturing processes of the embodiments shown in FIG. 11 to FIG. 14, only the main differences between the embodiments are described for the sake of brevity.

Referring to view AA', view BB' and view CC' of FIG. 15, a structure formed at this manufacturing stage is similar to the structure shown in FIG. 11, the main difference is that a top dielectric layer 260 is disposed on the patterned conductive layer 220a. Because the top dielectric layer 260 is formed after the blank deposition of the conductive layer as shown in FIG. 11 and before patterning the conductive layer to form the conductive blocks (not shown), the sidewalls of the patterned conductive layer 220a are not covered with the top dielectric layer 260. The thickness of the top dielectric layer 260 is ⅓ to 1/10 of the thickness of the patterned conductive layer 220a.

FIG. 16 is a schematic cross-sectional view at a manufacturing stage subsequent to FIG. 15 according to some embodiments of the present disclosure, where spacers are formed on a patterned conductive layer. After the structure shown in FIG. 15 is fabricated, a plurality of spacers 262 made of dielectric material are formed to cover the top surface of the top dielectric layer 260 and the sidewalls 211, 213 of the stacked structures 210.

Referring to view AA', view BB' and view CC' of FIG. 17, a structure formed at this manufacturing stage is similar to the structure shown in FIG. 13, the main difference is that the top dielectric layer 260 is disposed between the spacers 262 and the floating gates 224a. Then, the spacers 262 can be stripped. Afterwards, the upper gate structure and other components may be formed so as to obtain a non-volatile memory device similar to the structures shown in FIGS. 4-5.

Figure 18:
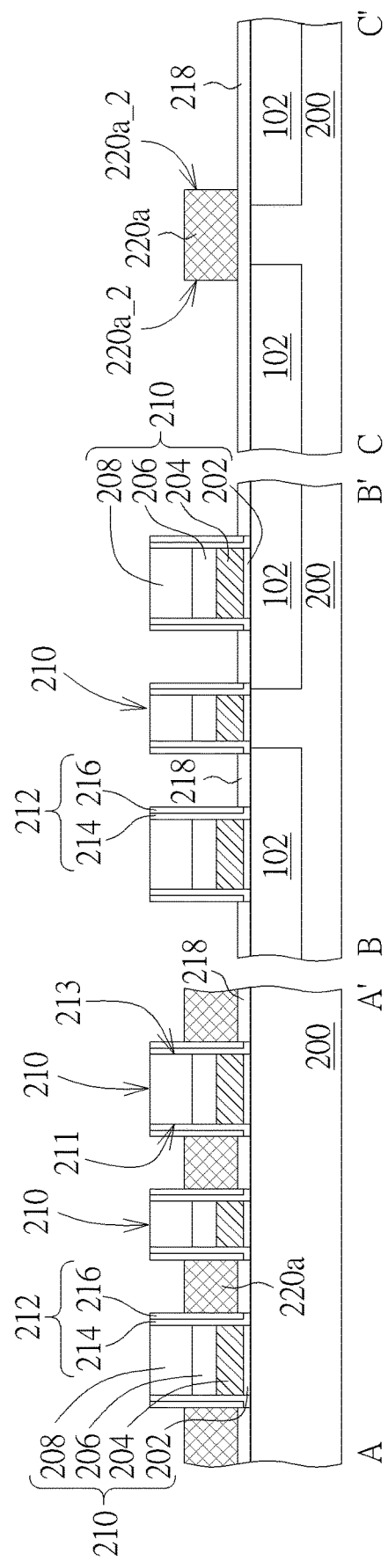
FIG. 18 to FIG. 19 are cross-sectional views at various stages of manufacture of a method for manufacturing the non-volatile memory device of FIGS. 1-3 according to some alternative embodiments of the invention.
Figure 19:
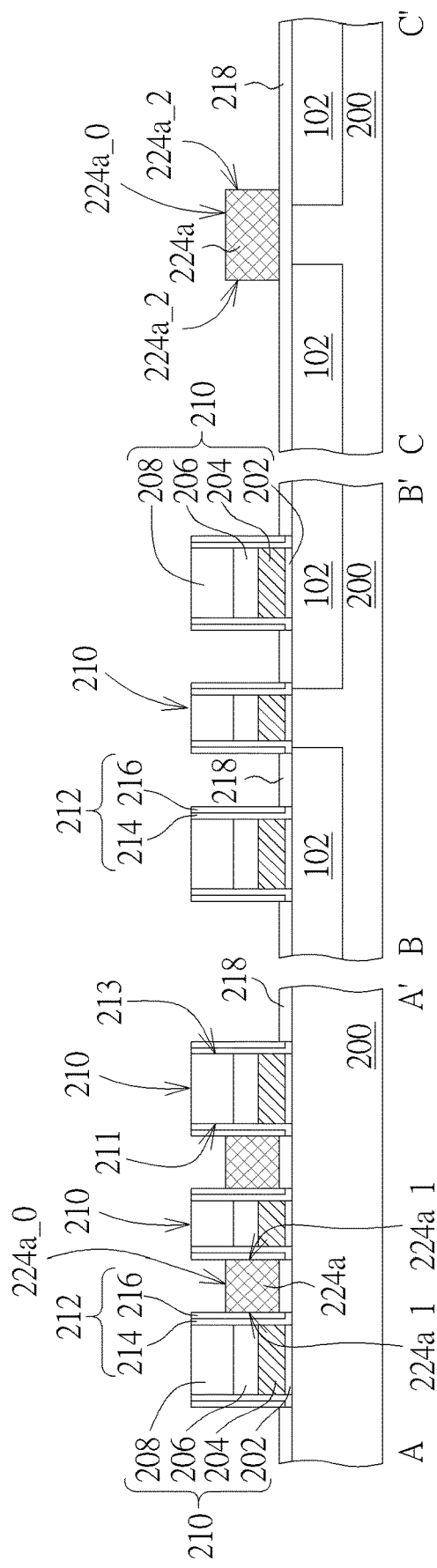

FIG. 18 to FIG. 19 are cross-sectional views at various stages of manufacture of a method for manufacturing the non-volatile memory device of FIGS. 1-3 according to some alternative embodiments of the invention. The manufacturing processes shown in FIGS. 18-19 are similar to the manufacturing processes shown in FIGS. 11-14, only the main differences between the embodiments are described for the sake of brevity.

Referring to view AA', view BB' and view CC' of FIG. 18, a structure formed at this manufacturing stage is similar to the structure shown in FIG. 11, the main difference is that an additional stacked structure 210 extending along a Y-direction is disposed on the substrate 200 between two adjacent stacked structure 210. Because of the presence of the additional stacked structure 210, the additional stacked structure 210 can be used to prevent the pattern conductive layer 220a from being formed in the regions already occupied by the additional stacked structure 210.

FIG. 19 is a schematic cross-sectional view at a manufacturing stage subsequent to FIG. 18 according to some alternative embodiments of the present disclosure. After the structure shown in FIG. 18 is fabricated, the pattern conductive layer disposed on the second sidewalls 213 of the stack structures 210 are stripped, and thus the floating gates 224a are formed.

Afterwards, the middle structure 240a, 240b shown in FIG. 2 can be fabricated to replace the additional stacked structure 210 disposed between two adjacent floating gates 224a. Then, the upper gate structure and other components may be formed so as to obtain a non-volatile memory device similar to the structures shown in FIGS. 1-3.

Figure 20:
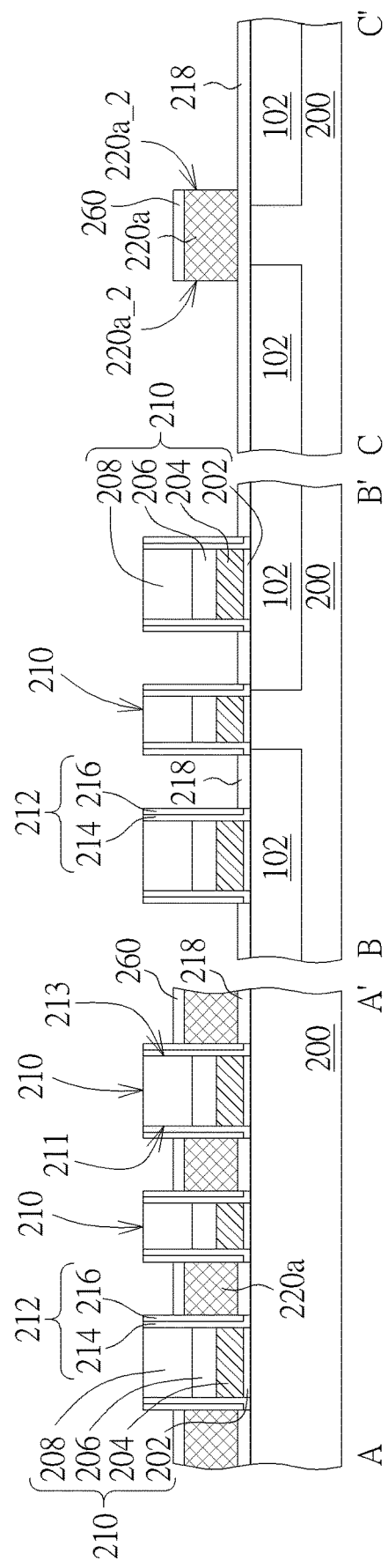
FIG. 20 to FIG. 21 are cross-sectional views at various stages of manufacture of a method for manufacturing the non-volatile memory device of FIGS. 4-5 according to some alternative embodiments of the invention.
Figure 21:
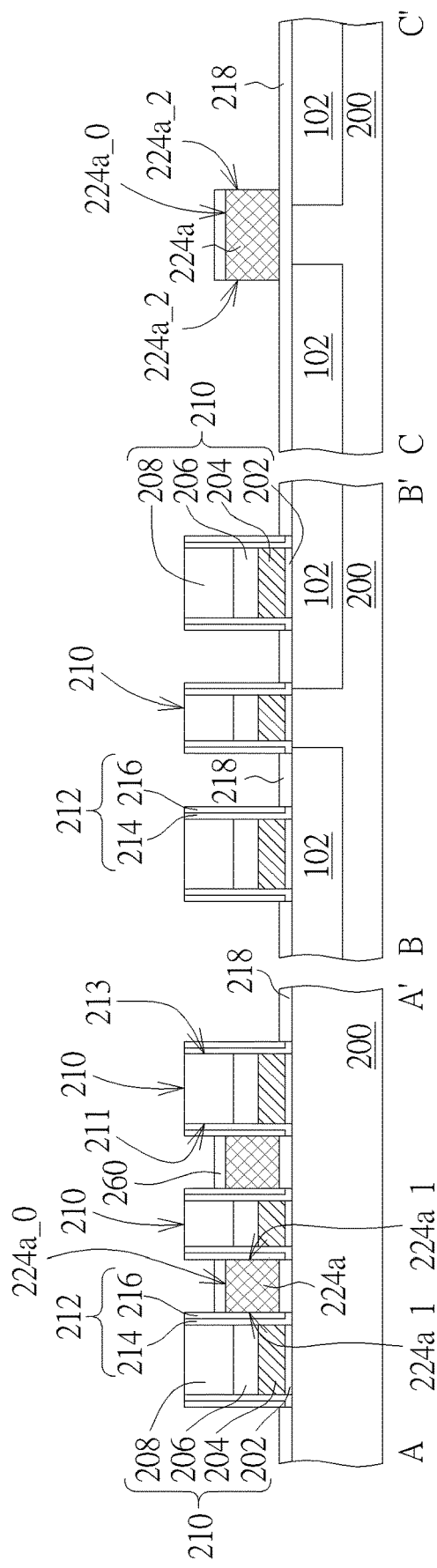

FIG. 20 to FIG. 21 are cross-sectional views at various stages of manufacture of a method for manufacturing the non-volatile memory device of FIGS. 4-5 according to some alternative embodiments of the invention. The manufacturing processes shown in FIGS. 20-21 are similar to the manufacturing processes shown in FIGS. 18-19, only the main differences between the embodiments are described for the sake of brevity.

Referring to view AA', view BB' and view CC' of FIG. 20, a structure formed at this manufacturing stage is similar to the structure shown in FIG. 18, the main difference is that a top dielectric layer 260 is disposed on the patterned conductive layer 220a. Because the top dielectric layer 260 is formed after the blank deposition of the conductive layer (not shown) and before patterning the conductive layer to form the conductive blocks (not shown), the sidewalls of the patterned conductive layer 220a are not covered with the top dielectric layer 260. The thickness of the top dielectric layer 260 is ⅓ to 1/10 of the thickness of the patterned conductive layer 220a.

FIG. 21 is a schematic cross-sectional view at a manufacturing stage subsequent to FIG. 20 according to some embodiments of the present disclosure. After the structure shown in FIG. 20 is fabricated, the pattern conductive layer 220a disposed on the second sidewalls 213 of the stack structures 210 are stripped, and thus the floating gates 224a are formed.

Afterwards, the additional stacked structure 210 can be replaced with the middle structure 240a, 240b shown in FIG. 4. Then, the upper gate structure and other components may be formed so as to obtain a non-volatile memory device similar to the structures shown in FIGS. 4-5.

FIG. 22 to FIG. 26 are cross-sectional views at various stages of manufacture of a method for manufacturing the non-volatile memory device of FIGS. 6-7 according to some embodiment of the invention. In FIG. 22 to FIG. 26, view AA', view BB' and view CC' correspond to the line A-A', line B-B', and line C-C' of FIG. 1, respectively. Besides, the manufacturing processes shown in FIGS. 22-26 can be regarded as being derived from to the manufacturing processes shown in FIGS. 11-14, only the main differences between the embodiments are described for the sake of brevity.

Figure 22:
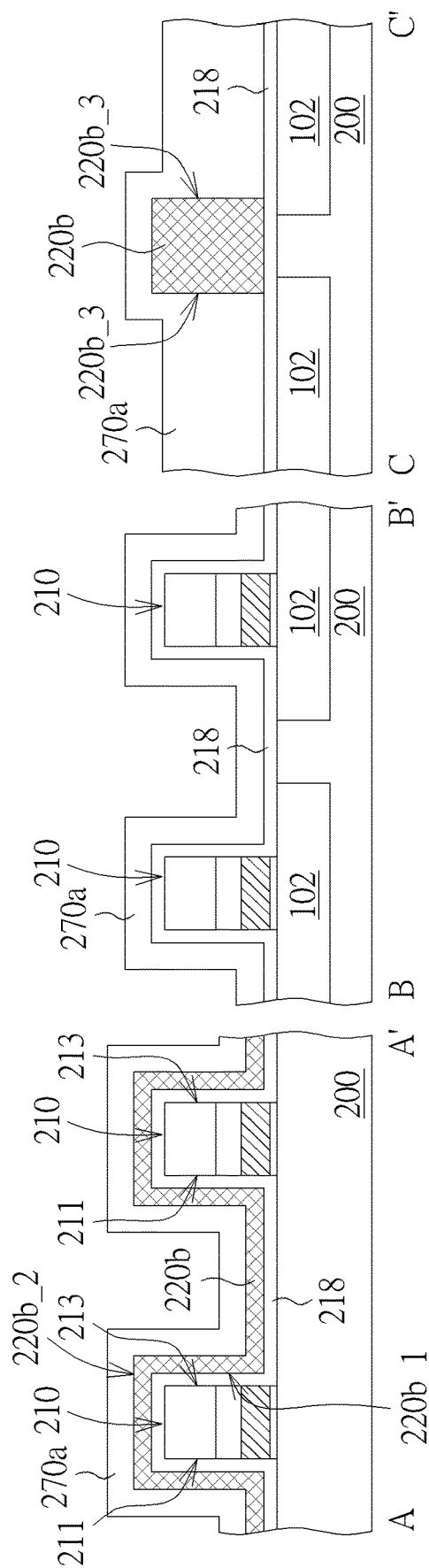
FIG. 22 to FIG. 26 are cross-sectional views at various stages of manufacture of a method for manufacturing the non-volatile memory device of FIGS. 6-7 according to some embodiment of the invention.

Referring to view AA', view BB' and view CC' of FIG. 22, a plurality of patterned conductive layers 220b are formed on the substrate 200. In view AA' of FIG. 22, the patterned conductive layer 220b is a continuous layer extending along an X-direction and covering the stacked structures 210. In view BB' of FIG. 22, none of the patterned conductive layer 220b exists. Thus, as viewed from a top-down perspective, each of the patterned conductive layers 220b is stripe in shape and extends in X-direction as shown in FIG. 8, and the patterned conductive layers 220b are spaced apart from each other along a Y-direction. Then, after the formation of the patterned conductive layers 220b, a blanket deposition is performed to form a conformal layer 270a covering the patterned conductive layers 220b and the substrate 200. In view CC' of FIG. 22, the sidewalls of the patterned conductive layers 220b are covered with the conformal layer 270a.

Figure 23:
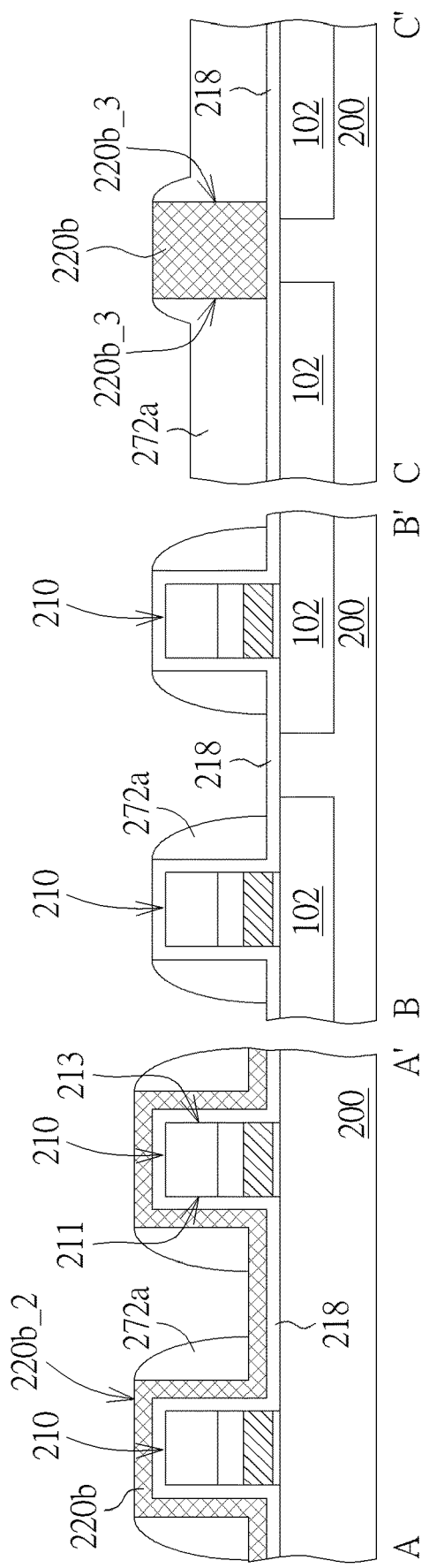

Then, referring to view AA', view BB' and view CC' of FIG. 23, the conformal layer 270a is etched by an anisotropic etching process to thereby form spacers 272a on the sidewalls 211, 213 of the stacked structure 210. In view CC' of FIG. 22, the sidewalls of the patterned conductive layers 220b are covered with the spacers 272a. The spacers 272a in this embodiment can be formed without performing any photolithography processes.

Figure 24:
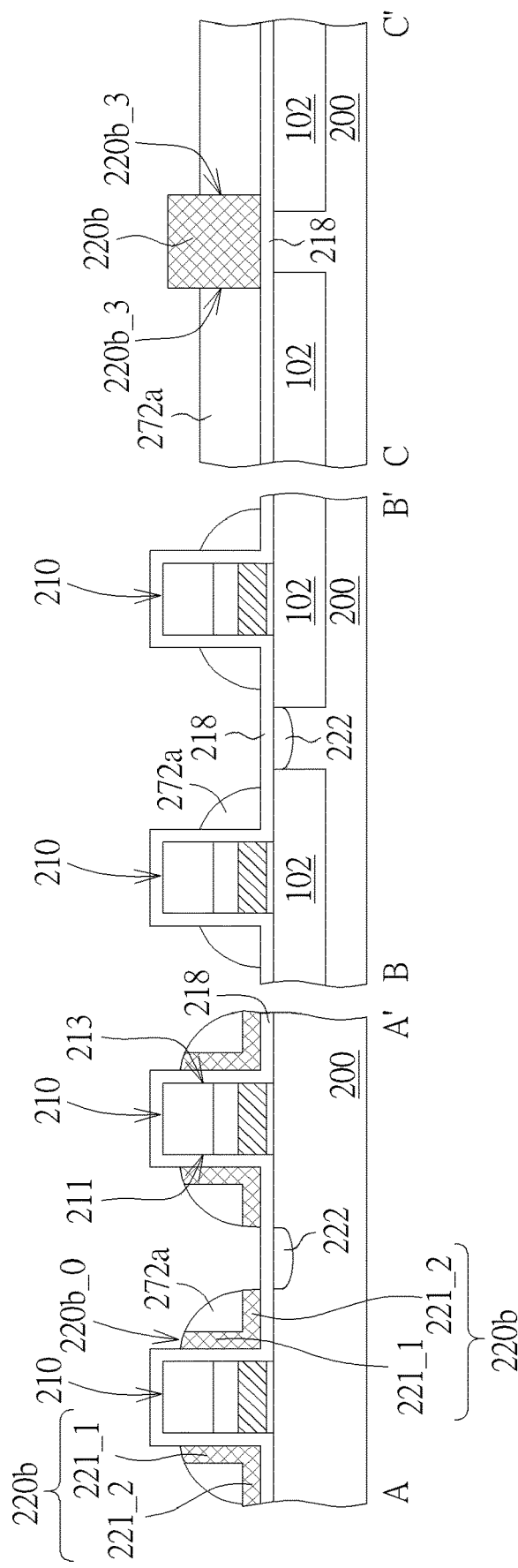

Afterwards, referring to view AA' of FIG. 24, the patterned conductive layers are etched using the spacers 272a as etch masks to thereby form L-shaped patterned conductive layers on the sidewalls 211, 213 of the stacked structures 210. Each L-shaped patterned conductive layer includes a vertical portion 221_1 and a horizontal portion 221_2. By using the spacers 272a as the etch masks, there is no need to perform additional photolithography process to define the contour of the L-shaped patterned conductive layer. Then, the source region 222 is formed in the substrate 200 between two adjacent spacers 272a disposed on the first sidewalls 211 of the stacked structures 210.

Figure 25:
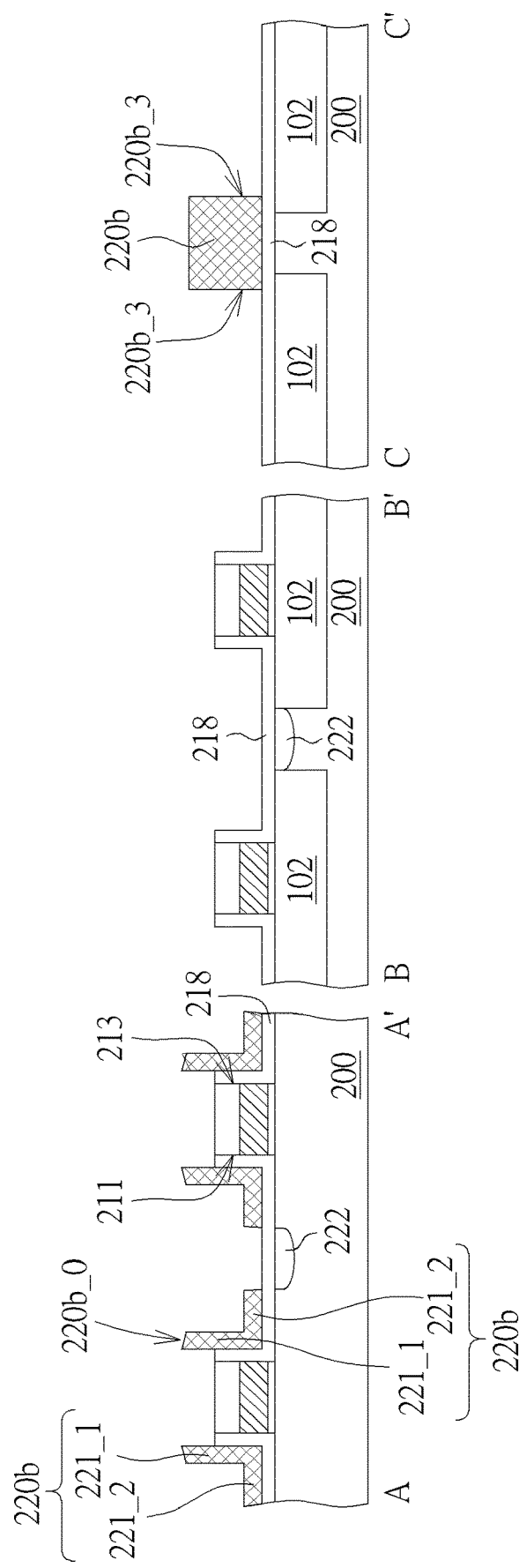

Afterwards, referring to view AA', view BB', and view CC' of FIG. 25, the spacers and the sacrificial layer are stripped. In this way, the top surface 220b_0 of the vertical portion 221_1 of the patterned conductive layer 220b can protrude from the top surface of the remaining stacked structure 210. Besides, in view CC' of FIG. 25, the sidewalls 220b_3 of the patterned conductive layer 220b are exposed.

Figure 26:
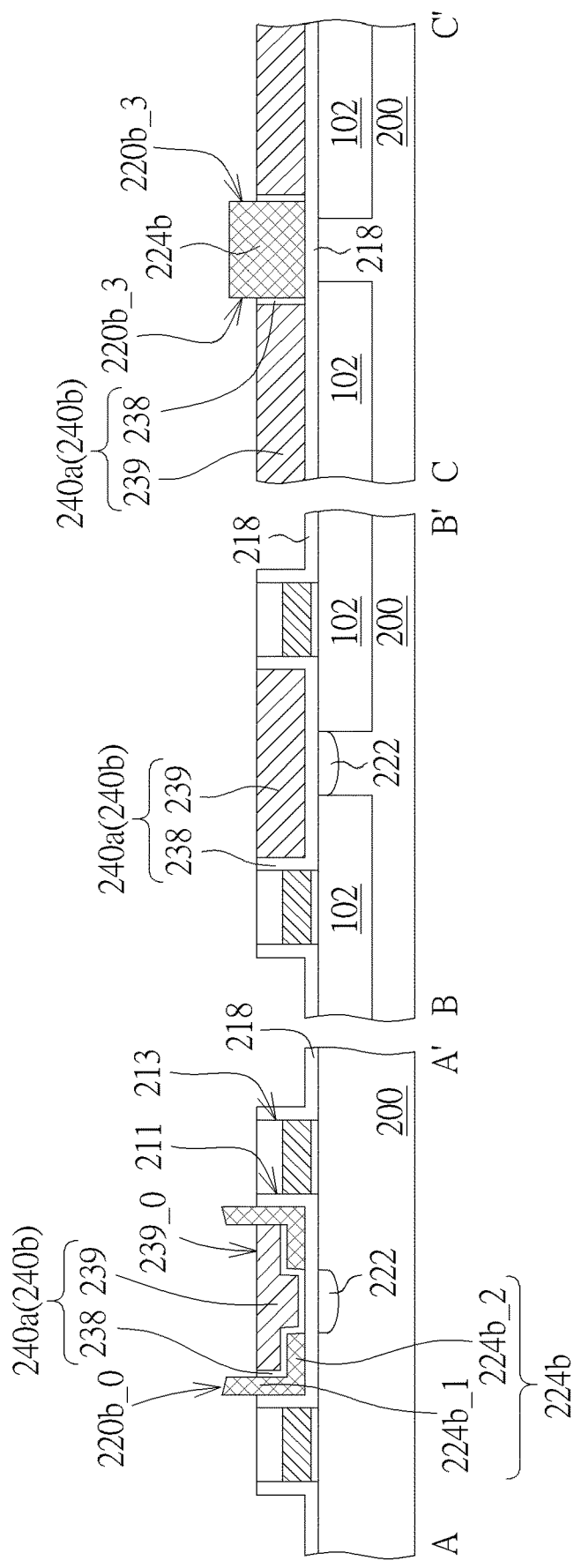

Afterwards, referring to view AA', view BB', and view CC' of FIG. 26, the patterned conductive layers disposed adjacent to the second sidewalls 213 of the stacked structures 210 are etched by performing a photolithography and etching process. Thus, the floating gates 224b are formed on the first sidewalls 211 of the stacked structures 210. Then, the middle structure 240a, 240b is formed in the gap between two adjacent stacked structures 210. In view AA' and view CC', the height of the middle structure 240a, 240b can be controlled properly so as to cover 65% to 95% of the sidewalls of the floating gates 224b.

Afterwards, the upper gate structure and other components may be formed so as to obtain a non-volatile memory device similar to the structures shown in FIGS. 6-7.

FIG. 27 to FIG. 30 are cross-sectional views at various stages of manufacture of a method for manufacturing the non-volatile memory device of FIGS. 8-10 according to some embodiment of the invention. In FIG. 27 to FIG. 30, view AA', view BB' and view CC' correspond to the line A-A', line B-B', and line C-C' of FIG. 8, respectively. Besides, since the manufacturing processes of the embodiments shown in FIG. 27 to FIG. 30 are similar to the manufacturing processes of the embodiments shown in FIG. 22 to FIG. 26, only the main differences between the embodiments are described for the sake of brevity.

Figure 27:
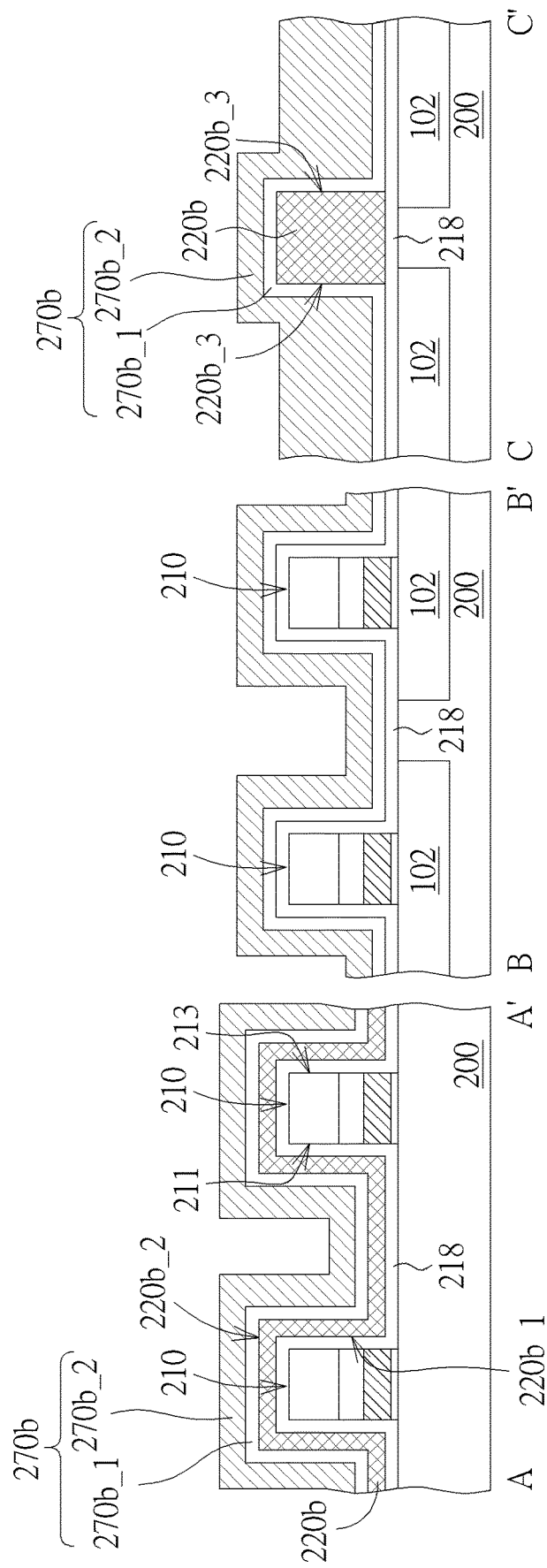
FIG. 27 to FIG. 30 are cross-sectional views at various stages of manufacture of a method for manufacturing the non-volatile memory device of FIGS. 8-10 according to some embodiment of the invention.

Referring to view AA', view BB' and view CC' of FIG. 27, a structure formed at this manufacturing stage is similar to the structure shown in FIG. 22, the main difference is that a stacked conformal layer 270b including a lower layer 270b_1 and an upper layer 270b_2 is used in place of the conformal layer 270a shown in FIG. 22. According to some embodiments of the present disclosure, the lower layer 270b_1 is a composite dielectric layer including silicon oxide/silicon nitride/silicon oxide, but not limited thereto. The upper layer 270b_2 is a conductive layer including polysilicon or metal, but not limited thereto.

Figure 28:
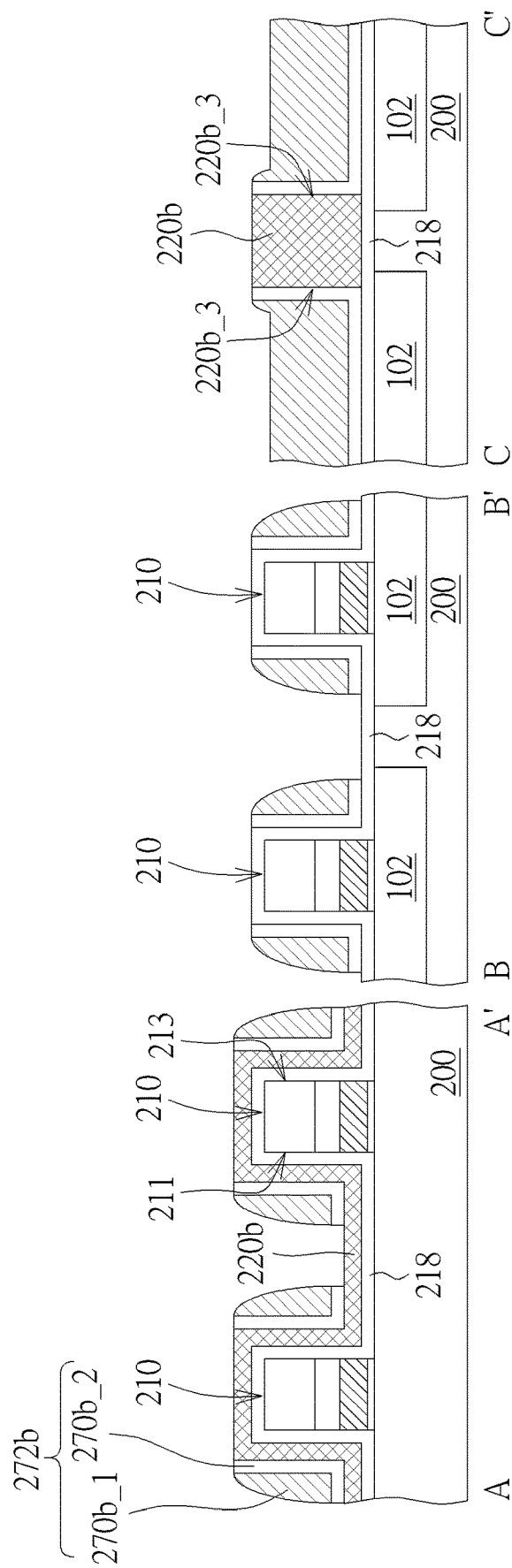

Then, referring to view AA', view BB' and view CC' of FIG. 28, the conformal layer 270b is etched by an anisotropic etching process to thereby form spacers 272b on the sidewalls 211, 213 of the stacked structure 210. In view CC' of FIG. 22, the sidewalls of the patterned conductive layers 220b are covered with the spacers 272b. The spacers 272b in this embodiment can be formed without performing extra photolithography processes.

Figure 29:
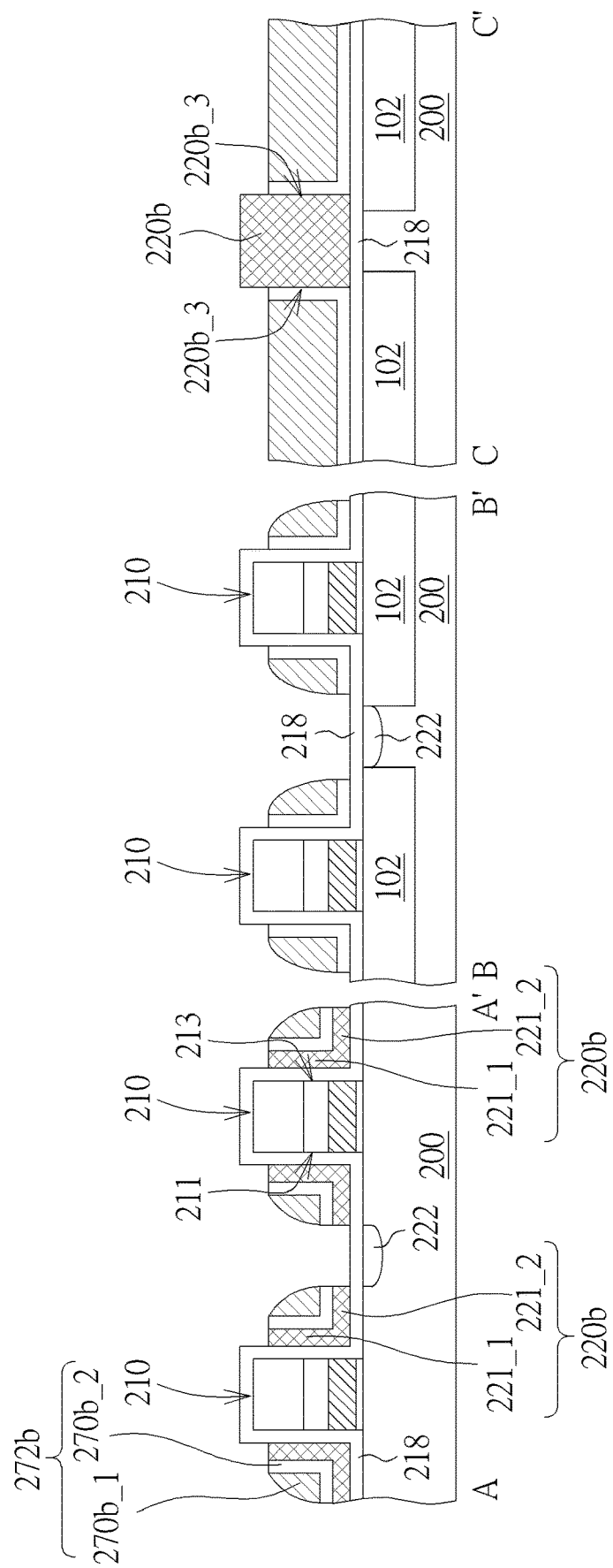
Figure 30:
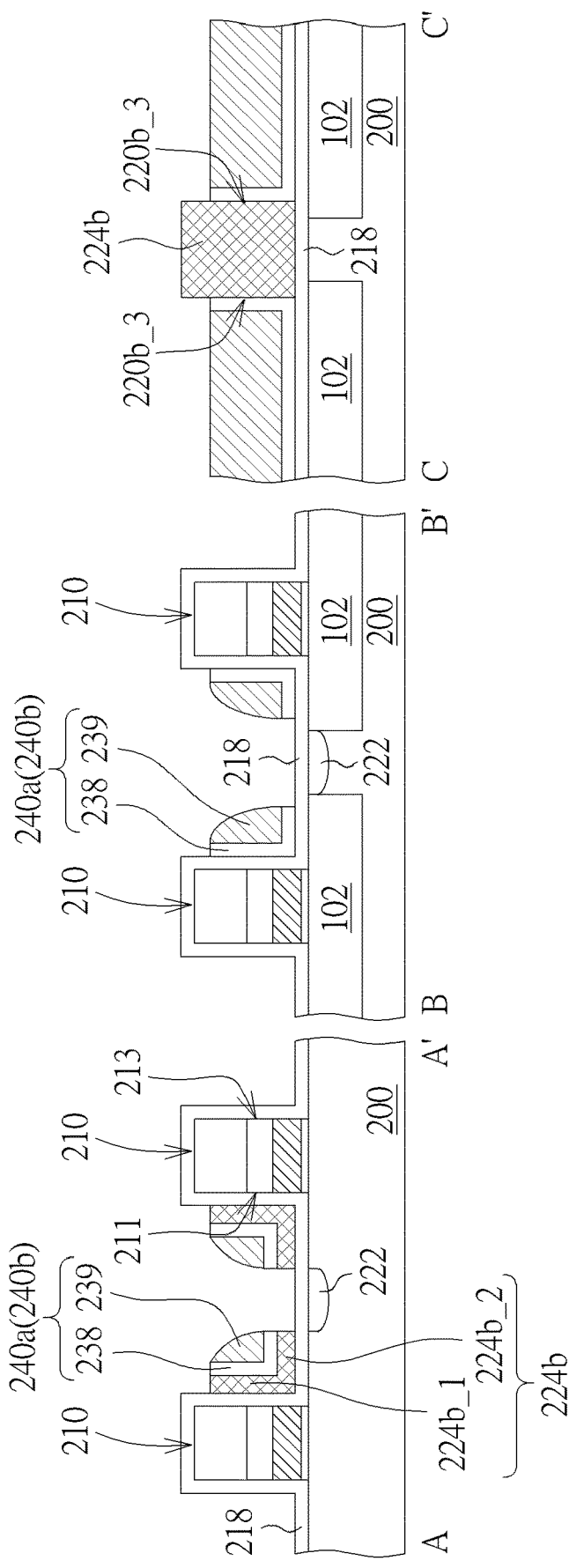

Afterwards, referring to view AA' of FIG. 29, the patterned conductive layers are etched using the spacers 272b as etch masks to thereby form L-shaped patterned conductive layers on the sidewalls 211, 213 of the stacked structures 210. Each L-shaped patterned conductive layer includes the vertical portion 221_1 and the horizontal portion 221_2. By using the spacers 272b as the etch masks, there is no need to perform additional photolithography process to define the contour of the L-shaped patterned conductive layer. Then, the source region 222 is formed in the substrate 200 between two adjacent spacers 272b disposed on the sidewalls 211 of the stacked structures 210.

Afterwards, referring to view AA', view BB', and view CC' of FIG. 26, the patterned conductive layers and the spacers disposed adjacent to the second sidewalls 213 of the stacked structures 210 are etched by performing a photolithography and etching process. Thus, the floating gates 224b and the middle structure 240a, 240b are formed on the first sidewalls 211 of the stacked structures 210. In other words, the middle structure 240a, 240b are formed from the original stacked conformal layer 270a as shown in FIG. 27. In view AA' and view CC', the height of the middle structure 240a, 240b can be controlled properly so as to cover 65% to 95% of the sidewalls of the floating gates 224b.

Afterwards, the upper gate structures and other components may be formed so as to obtain a non-volatile memory device similar to the structures shown in FIGS. 8-10.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory device, comprising at least one memory cell, wherein the at least one memory cell comprises:
    a substrate;
    an assist gate structure disposed on the substrate and comprising a gate dielectric layer;
    a tunneling dielectric layer disposed on the substrate at one side of the assist gate structure;
    a floating gate disposed on the tunneling dielectric layer and comprising:
        two first top edges opposite each other and arranged along a first direction;
        two first sidewalls opposite each other and arranged along the first direction, wherein the first sidewalls are connected to the first top edges respectively; and
        two second sidewalls opposite each other and arranged along a second direction different from the first direction;
    an upper gate structure covering the assist gate structure and the floating gate, wherein at least one of the first top edges of the floating gate is embedded in the upper gate structure, the upper gate structure is configured to act as an erase gate structure,
    a middle structure covering the second sidewalls of the floating gate;
    wherein portions of the upper gate structure extend beyond the second sidewalls of the floating gate in the second direction, and the portions of the upper gate structure are disposed above the substrate, wherein the middle structure is disposed between the portions of the upper gate structure and the substrate, and a top surface of the middle structure is covered with a bottom surface of the portions of the upper gate structure.

2. The non-volatile memory device of claim 1, wherein one of the first sidewalls of the floating gate faces and is covered with the assist gate structure.

3. The non-volatile memory device of claim 2, wherein another one of the first sidewalls is opposite the assist gate structure, and the first sidewall opposite the assist gate structure is a vertical or inclined sidewall.

4. The non-volatile memory device of claim 1, wherein the first top edges of the floating gate are higher than a top surface of the assist gate structure.

5. The non-volatile memory device of claim 1, wherein a bottom surface of the portions of the upper gate structure disposed above the substrate is lower than the first top edges of the floating gate.

6. The non-volatile memory device of claim 1, wherein the middle structure is configured to act as a control gate structure.

7. The non-volatile memory device of claim 6, wherein portions of the control gate structure are covered with the portions of the upper gate structure extending beyond the second sidewalls of the floating gate.

8. The non-volatile memory device of claim 6, wherein a top surface of the control gate is lower than a top surface of the portions of the upper gate structure.

9. The non-volatile memory device of claim 8, wherein the top surface of the control gate structure is covered with the upper gate structure.

10. The non-volatile memory device of claim 6, wherein a top surface of the control gate structure is lower than the first top edges.

11. The non-volatile memory device of claim 1, wherein the at least one memory cell further comprises a top dielectric layer disposed on the floating gate, wherein a top surface of the top dielectric layer is covered with the upper gate structure.

12. The non-volatile memory device of claim 11, wherein the area of the top surface of the top dielectric layer is less than the area of a top surface of the floating gate.

13. The non-volatile memory device of claim 1, wherein the floating gate further comprises a vertical portion and a horizontal portion, wherein a top surface of the vertical portion is higher than a top surface of the horizontal portion.

14. The non-volatile memory device of claim 13, wherein the vertical portion of the floating gate comprises the first top edges.

15. The non-volatile memory device of claim 13, wherein the at least one memory cell further comprises a control gate structure covering a top surface of the horizontal portion of the floating gate.

16. The non-volatile memory device of claim 1, wherein the at least one memory cell comprising a first memory cell and a second memory cell, each of the first memory cell and the second memory cell comprising the assist gate structure and the floating gate, the non-volatile memory device further comprises a source region shared by the first memory cell and the second memory cell, and the source region is covered with the upper gate structure.

17. The non-volatile memory device of claim 16, wherein the first memory cell and the second memory cell have a mirror image of each other.

18. The non-volatile memory device of claim 16, wherein the upper gate structure fills up a gap between the floating gates of the first memory cell and the second memory cell.

19. The non-volatile memory device of claim 16, wherein the middle structure is configured to act as a control gate structure shared by the first memory cell and the second memory cell, wherein the control gate structure covers the source region.

20. The non-volatile memory device of claim 19, further comprising an isolation structure disposed in the substrate, wherein the portions of the upper gate structure extending beyond the second sidewalls of the floating gate are disposed above the isolation structure.

* * * * *